(12) United States Patent
Monga

(10) Patent No.: US 9,184,748 B2
(45) Date of Patent: Nov. 10, 2015

(54) ADAPTIVE BUFFER

(71) Applicant: STMicroelectronics International N.V., Amsterdam (NL)

(72) Inventor: Sushrant Monga, New Delhi (IN)

(73) Assignee: STMicroelectronics International N.V., Amsterdam (NL)

( * ) Notice: Subject to any disclaimer, the term of this patent is extended or adjusted under 35 U.S.C. 154(b) by 36 days.

(21) Appl. No.: 13/675,307

(22) Filed: Nov. 13, 2012

(65) Prior Publication Data

US 2013/0169311 A1 Jul. 4, 2013

(30) Foreign Application Priority Data

Dec. 30, 2011 (IN) .......................... 3882/DEL/2011

(51) Int. Cl.
*H03K 19/003* (2006.01)
*H03K 19/00* (2006.01)
*H04L 25/02* (2006.01)

(52) U.S. Cl.
CPC .......... *H03K 19/0005* (2013.01); *H04L 25/028* (2013.01); *H04L 25/0278* (2013.01)

(58) Field of Classification Search
CPC . H03K 19/0005; H03K 17/687; H03K 19/01; H03K 19/018521; H03K 19/018571; H03K 19/018564; H04L 25/0278; H04L 25/0298; H04L 25/0272; H04L 25/028; H04L 25/0292; G06F 13/4072; G06F 13/4004
USPC .......................... 326/21–30, 86; 327/108–112
See application file for complete search history.

(56) References Cited

U.S. PATENT DOCUMENTS

| | | | |
|---|---|---|---|
| 5,134,311 A | 7/1992 | Biber et al. | |
| 5,448,182 A | 9/1995 | Countryman et al. | |
| 6,549,036 B1 * | 4/2003 | Lee | 326/83 |
| 6,566,904 B2 * | 5/2003 | van Bavel et al. | 326/30 |
| 6,885,959 B2 * | 4/2005 | Salmon et al. | 702/107 |
| 6,924,660 B2 * | 8/2005 | Nguyen et al. | 326/30 |
| 7,093,145 B2 * | 8/2006 | Werner et al. | 713/300 |
| 7,096,303 B1 * | 8/2006 | Caruk et al. | 710/306 |
| 7,120,840 B1 * | 10/2006 | Shimanouchi | 714/700 |
| 7,194,559 B2 * | 3/2007 | Salmon et al. | 710/8 |
| 7,248,635 B1 * | 7/2007 | Arneson et al. | 375/257 |
| 7,368,936 B2 | 5/2008 | Huang | |
| 7,389,194 B2 * | 6/2008 | Nguyen et al. | 702/107 |
| 7,649,364 B2 * | 1/2010 | Cortigiani et al. | 324/601 |
| 7,808,278 B2 * | 10/2010 | Nguyen et al. | 326/87 |
| 7,863,936 B1 * | 1/2011 | Liu et al. | 326/86 |
| 7,940,078 B2 * | 5/2011 | Pan | 326/30 |
| 7,990,178 B2 * | 8/2011 | Liu et al. | 326/83 |
| 8,049,474 B2 * | 11/2011 | Bernacchia et al. | 323/272 |
| 8,531,206 B2 * | 9/2013 | Amirkhany et al. | 326/30 |
| 8,553,471 B2 * | 10/2013 | Kim et al. | 365/189.05 |

OTHER PUBLICATIONS

Hitesh N. Patel, Jakob H. Hohl, and Olgierd A. Palusinski, "An Adaptive CMOS Transmission Line Driver", Sixth Annual IEEE International ASIC Conference and Exhibit, 1993, pp. 460-463.

(Continued)

*Primary Examiner* — Vibol Tan
(74) *Attorney, Agent, or Firm* — Gardere Wynne Sewell LLP

(57) ABSTRACT

An embodiment of a buffer for a transmission line, a circuit including such a buffer, a high-speed data link, and a low-voltage differential signaling (LVDS) system.

21 Claims, 21 Drawing Sheets

(56) References Cited

OTHER PUBLICATIONS

Thomas F. Knight, Jr., and Alexander Krymm, "A Self-Terminating Low-Voltage Swing CMOS Output Driver", IEEE Journal of Solid-State Circuits, vol. 23, No. 2, Apr. 1988, pp. 457-464.

Gianluigi De Geronimo, Anand Kandasamy, and Paul O'Connor, "Analog Peak Detector and Derandomizer for High-rate Spectroscopy", IEEE Transactions on Nuclear Science, vol. 49, No. 4, Aug. 2002, pp. 1769-1773.

* cited by examiner

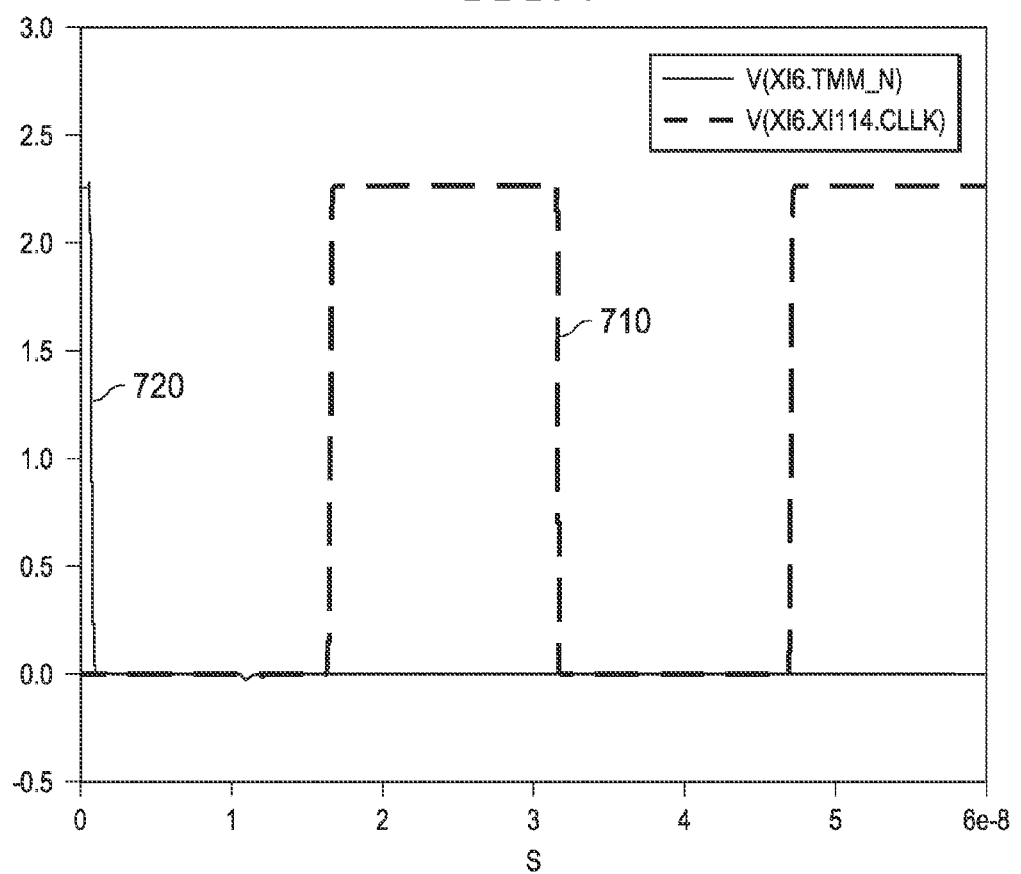

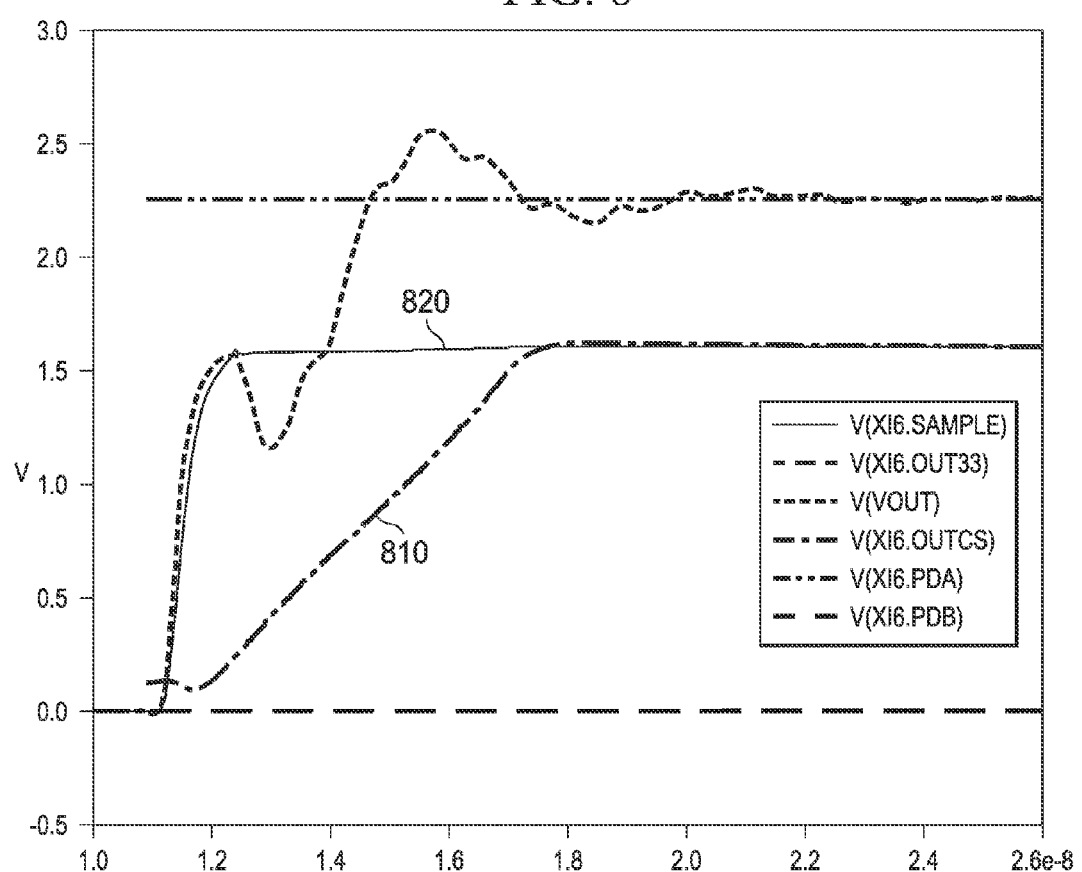

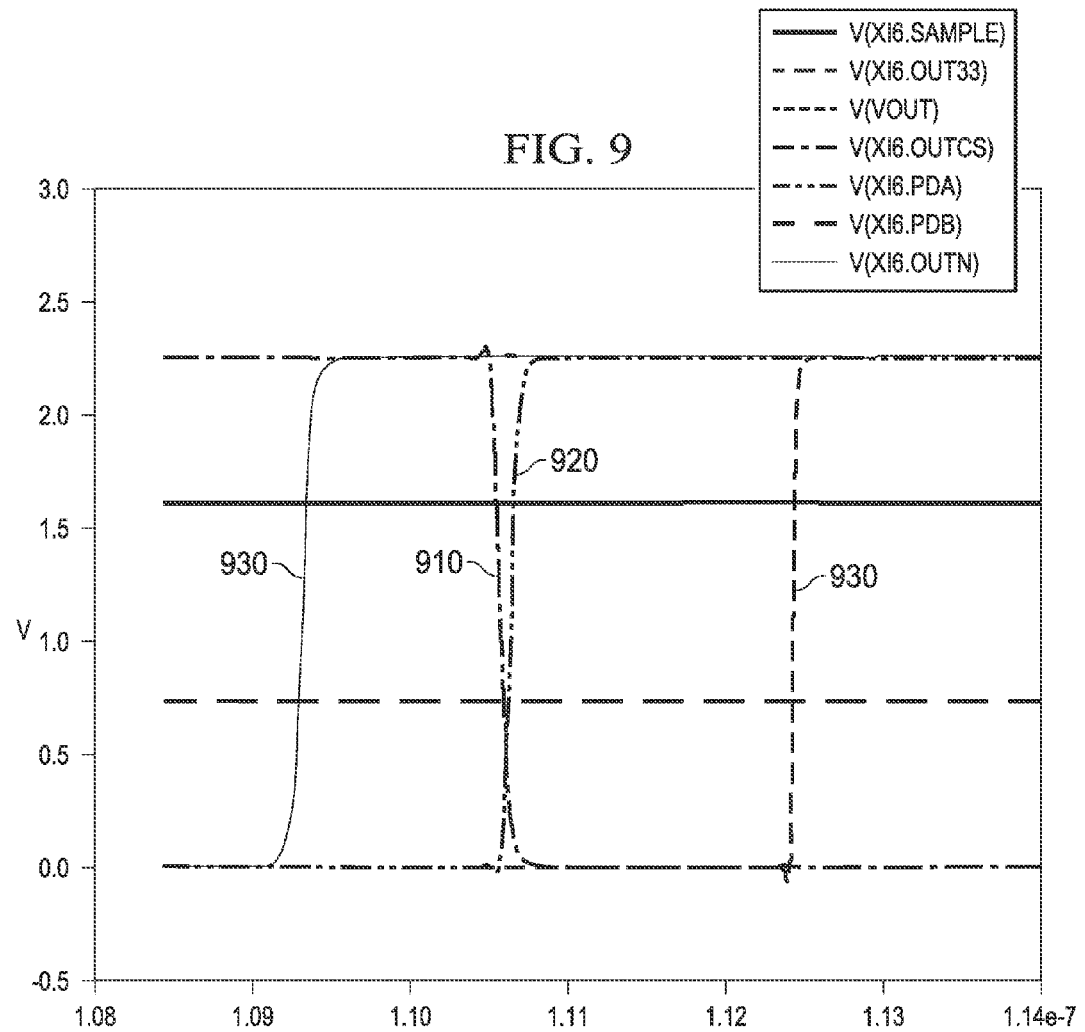

ADAPTIVE BUFFER

PRIORITY CLAIM

The instant application claims priority to Indian Patent Application No. 3882/DEL/2011, filed Dec. 30, 2011, which application is incorporated herein by reference in its entirety.

TECHNICAL FIELD

An embodiment relates broadly to a buffer for a transmission line, to a circuit including such a buffer, to a low-voltage differential signaling system, and to a high-speed link.

BACKGROUND

In a circuit employing an input/output (I/O) buffer (also known as line driver), the buffer is typically put on a transmission line whose characteristic impedance is unknown, but known to lie in the range of, for example, 30-120 ohms. The far-end of the line is capacitively loaded with the value of the load capacitor, which is typically bounded within the range of, for example, 5 pF-50 pF. As the loads at both ends are not matched with the transmission line, this will result in reflection occurring at both ends of the line, thereby distorting the signals communicated over it. The memory in the channel in the form of previous bits reflected from both ends can cause a reduced eye opening and high jitter at the receiving end, thereby causing an increased bit error rate (BER). For example, in most high-speed applications for the design of serial links, the termination impedance at the receiver end of the transceiver system has to be matched to the transmission line's impedance to control the reflections and jitter at gigabits per second. As the system operates at very high speeds, it is very sensitive to sub-pico-second jitters and other reflections that occur at both ends of the transmission line. Therefore, it is often very important to calibrate this termination impedance equal to the unknown impedance of the transmission line with high accuracy.

There have been attempts at solving the above problems. For example, in one method that has been used in some video-line drivers, the calibration has been proposed in the analog domain, whereby the current of the buffer is set depending upon the current division among the buffer and the line. In another proposed method, handshaking provides the necessary information from the receiver's end on the same channel, which gives the information about the eye closure of the eye; then equalization is done at the transmitter's end.

SUMMARY

Therefore, a need exists to provide a line driver for high-speed applications that seek to solve at least some of the above problems.

In accordance with a first example embodiment, there is provided a buffer for a transmission line, the buffer including:

a driver module configured to be coupled to the transmission line;

a receiver module configured to receive an output signal of the driver module; and a calibration module configured to receive a trigger signal from the receiver module for initiating calibration of the buffer;

wherein the driver module is further configured to adjust an output impedance of the buffer to match that of the transmission line based on a calibration code generated by the calibration module.

The calibration code may be generated by the calibration module in a calibration phase prior to an operation phase.

The driver module may be configured to provide a test signal to the transmission line in the calibration phase, and the receiver module may be configured to sample a peak output voltage of the test signal at a near end of the transmission line.

The driver module may include a bootstrap sampling circuit coupled to a track-and-hold circuit for sampling the peak output voltage.

The sampled output voltage may be compared with a calibration output voltage generated at the calibration module.

The calibration module may include:

a first pull-up-impedance block configured to provide an impedance emulating the impedance of the buffer; and a first pull-down-impedance block coupled in series with the pull-up-impedance block, and configured to provide a variable impedance emulating the impedance of the transmission line;

wherein the calibration output voltage is generated at a point between said pull-up- and pull-down-impedance blocks.

The first pull-down-impedance block may include a binary-configured resistor, and the calibration module further including a counter configured to generate a digital code for varying the impedance of the first pull-down-impedance block, and thereby varying the calibration output voltage.

The digital code may be latched as the calibration code when the sampled output voltage is approximately equal to the calibration output voltage.

The calibration code may be provided to the driver module for adjusting the impedance of the buffer in the operation phase.

The driver module may include a second pull-up-impedance block and a second pull-down-impedance block configured to adjust the impedance of the buffer in the operation phase based on the received calibration code.

The driver module may further include an adjunct pull-up-impedance block configured to be active only in the calibration phase.

The calibration code may be configured to be reset after a cycle including the calibration phase and the operation phase.

In accordance with a second example embodiment, there is provided a circuit including a buffer as defined in the first example embodiment.

In accordance with a third example embodiment, there is provided a high-speed link including a transmission line configured to be coupled to a buffer, the buffer including:

a driver module configured to be coupled to the transmission line;

a receiver module configured to receive an output signal of the driver module; and a calibration module configured to receive a trigger signal from the receiver module for initiating calibration of the buffer;

wherein the driver module is further configured to adjust an output impedance of the buffer to match that of the transmission line based on a calibration code generated by the calibration module.

In accordance with a fourth example embodiment, there is provided a low-voltage differential-signaling system including a pair of transmission lines, wherein at least one of the transmission lines is configured to be coupled to a buffer including:

a driver module configured to be coupled to the transmission line;

a receiver module configured to receive an output signal of the driver module; and a calibration module configured to receive a trigger signal from the receiver module for initiating calibration of the buffer;

wherein the driver module is further configured to adjust an output impedance of the buffer to match that of the transmission line based on a calibration code generated by the calibration module.

BRIEF DESCRIPTION OF THE DRAWINGS

Embodiments will be better understood from the following written description, by way of example only, and in conjunction with the drawings, in which:

FIG. 4b shows a circuit diagram illustrating connections between a pre-driver circuit and the driver module of FIG. 4a.

FIG. 7 shows a screen capture illustrating generation of a clock signal according to an example embodiment.

FIG. 8 shows a screen capture illustrating behavior of an output of the op-amp according to an example embodiment.

FIG. 9 shows a screen capture illustrating generation of the delayed signals according to an example embodiment.

DETAILED DESCRIPTION

Figure 1:
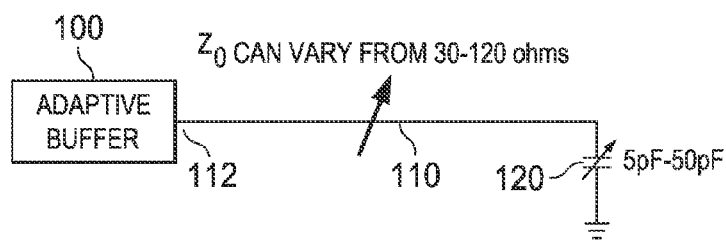
FIG. 1 shows a schematic diagram illustrating generally an implementation of an adaptive buffer in a circuit according to an example embodiment.

FIG. 1 shows a schematic diagram illustrating generally an implementation of an adaptive buffer 100 in a circuit according to an example embodiment. The adaptive buffer 100 can be configured to tune its output/driving impedance automatically by sensing the external environment, i.e., transmission line 110's characteristic impedance $Z_O$, which drives an unknown capacitance (load) 120 coupled at a far-end of the transmission line 110. The capacitance 120 can have a value between about 5 pF-50 pF. This value is typically stated in specifications for the application running at a particular frequency of operation. The transmission line 110 can have the characteristic impedance $Z_O$ anywhere ranging from about 30-120 Ohms.

Figure 2A:
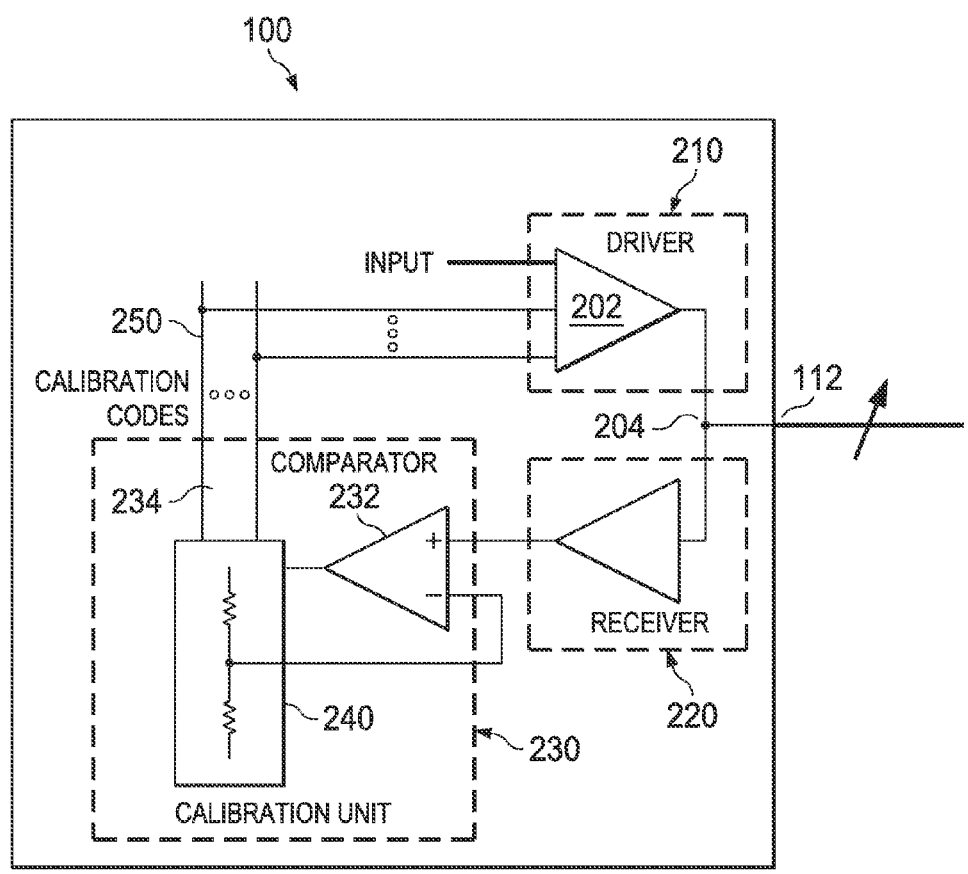
FIG. 2a shows a schematic diagram illustrating main components of the adaptive buffer of FIG. 1 according to an example embodiment.
Figure 2B:
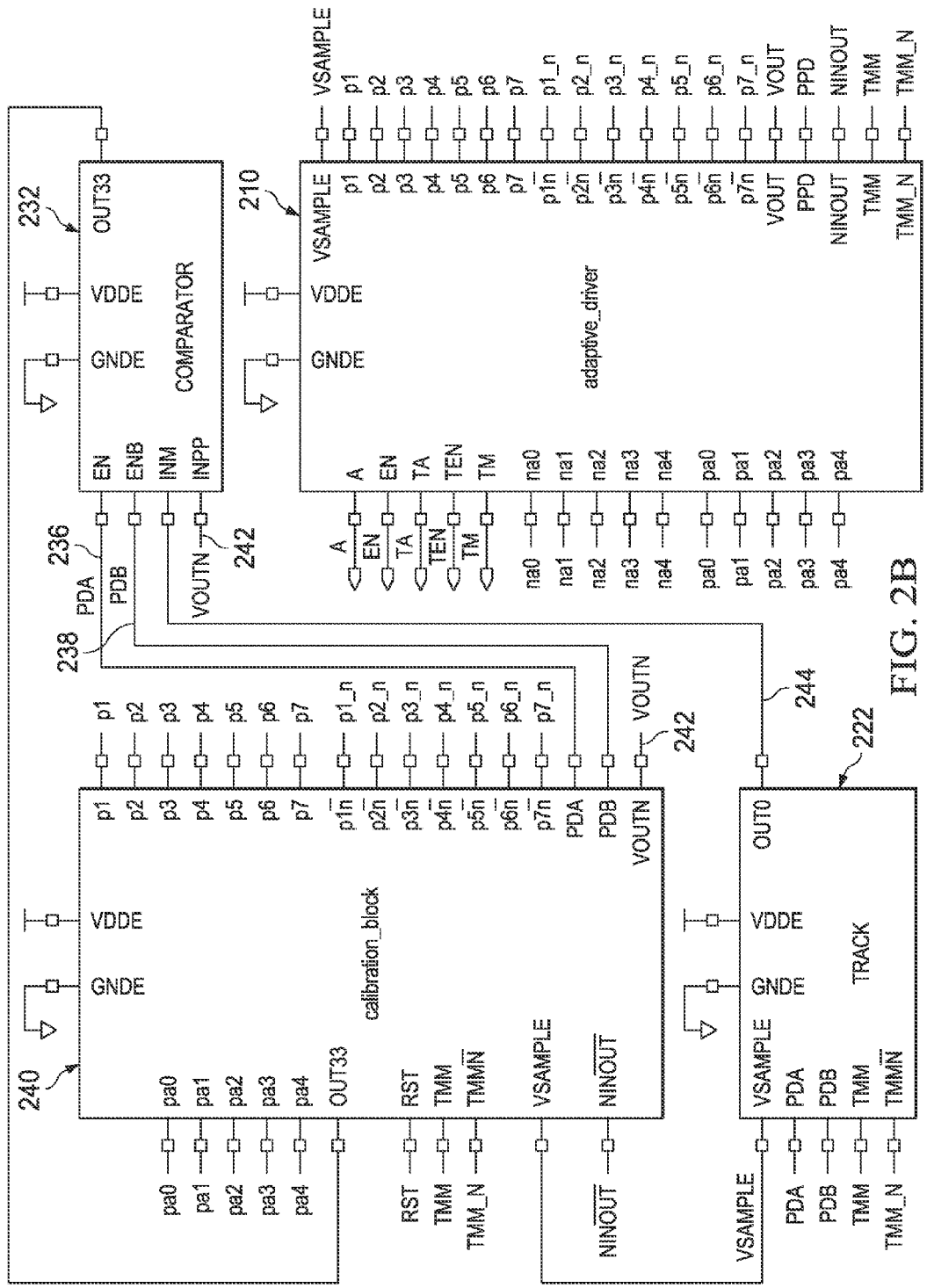
FIG. 2b shows a circuit diagram of the adaptive buffer of FIG. 2a in an example implementation.

FIG. 2a shows a schematic diagram illustrating main components of the adaptive buffer 100 of FIG. 1 according to an example embodiment. FIG. 2b shows a circuit diagram of the adaptive buffer 100 in an example implementation. The adaptive buffer 100 includes three modules that are distributed among the core and I/O areas, namely, a driver module 210 containing the output driver 202's circuitry and an I/O pad 204, which interfaces the output with the external environment, a sensor/receiver module 220, and a calibration module 230, which is stationed in the core. When deployed, the adaptive buffer 100 senses a given environment and calibrates its output (0/P) impedance digitally through a code, which is then distributed to other I/O devices (not shown), e.g., high-speed data links, low-voltage differential-signaling (LVDS) systems, etc., of variable speed and applications ranging from the megahertz (MHz) range to the gigahertz (GHz) range to calibrate them for efficient operation. The code also can calibrate the input termination impedance at the receiving end of, e.g., the gigabit transceiver to a high accuracy. Other I/O devices typically have a similar or a similarly scaled architecture at the output of these devices or at the input-termination circuitry so as to efficiently update impedances through the respective digital codes.

An example adaptive buffer 100 has a push-pull architecture with the P- and N-impedances constituted by the parallel combination of the basic unit cell. This unit cell includes a series combination of a metal-oxide semiconductor (MOS) transistor and a poly-resistor. This basic unit cell of impedance has reduced dynamic range of impedance over the process, voltage, and temperature (PVT) variations. The adaptive buffer 100's driving stage includes parallel and scaled branches of the basic unit of impedance (described above) to accommodate the calibration code, for adjusting the impedance dynamically. Initially, the impedance of the P-driver is set at a default value by the default code, which is set at the initial time of start.

In an embodiment, the adaptive buffer 100's impedance is dynamically calibrated by mixed-signal circuits to match the given transmission line 110's impedance, guided by the operational principle of "plug and play". This is done, for example, by capturing the voltage of the wave launched at the near end 112 of the transmission line 110. This is accomplished in two phases; the training phase and the operation phase. In the training phase, the driver module 210 to be calibrated is plugged into the transmission line 110 and a single transition on the line is triggered by the control signals. The output voltage is sampled by a high-speed bootstrap sampling circuit (FIG. 5d) and further held by a track-andhold circuit 222 (FIG. 2b) for a maximum time of, for example, 1.3 microseconds (μs) (calibration time).

During this time span, the sampled voltage (244 in FIG. 2b) is fed to the calibration module 230 including a similar scaled P-drive stage as the driver in series with an N-drive stage emulating the transmission line coupled between the supplies. An analog-to-digital (A/D) conversion circuit (which includes a calibration circuit and a comparator with the supporting clock and digital circuitry, as described below with respect to FIGS. 6b-6d) compares the two voltages, one (244 in FIG. 2b) coming from the output (the near end of the transmission line 110) of the actual driver module 210 and the other (VOUTN 242 in FIG. 2b) coupled to the mid-point of the emulated impedance stage 240 (FIG. 2a). A counter (FIG. 6b) increments the code to the lower N-impedance at a particular process, voltage, and temperature (PVT), and the calibration code is obtained when the two voltages (driver's O/P and the emulated-O/P-impedance voltage) are equal. This is independent of PVT in an embodiment where the running condition of the driver is matched to the transmission environment (within an accuracy of approximately +/−10%), that is, where the components (e.g., transistors) of the output driver 202 are matched to the components of the comparator 232. Hence, this may also solve the problem of impedance variation and eye distortion across PVT.

As described above, in an example embodiment, the adaptive buffer 100 operates in two modes, namely a sense-and-calibrate mode (calibration phase) and a normal mode (operation phase). In the sense-and-calibrate mode, the adaptive buffer 100 senses and calibrates. After the calibration is accomplished, the adaptive buffer 100 is ready to be used, in the normal mode, as an output driver for a given set of specifications.

For example, in the sense-and-calibrate mode, the driver module 210 provides a test signal, which is driven on the unknown load 120 (FIG. 1) through the transmission line 110 (FIG. 1) of unknown impedance. The launched voltage at the near end 112 of the transmission line 110 before the incoming reflected waveform (from the far end of the transmission line) reaches this end is sampled and compared to a digitally coded voltage VOUTN 242 (which is generated from impedance stage 240) at a comparator 232 in the calibration module 230. The code, which is counted up/down by a counter to cross a given voltage with minimum error, is considered the final calibration code. The calibration steps include reading the transmission line 110's voltage before reflection and converting this into a readable digital code for calibration of the output buffer. This will be described in detail below. The window for reading the code is given by $(2*T_L - T_{R/F})$ where $T_L$ is the transmission time in the forward/backward path and $T_{R/F}$ is the rise or fall time at the I/O pad 204. That is, the length of the window is the difference between the time it takes for the reflection from the far end of the transmission line 110 to arrive at the near end of the transmission line and the rise time of a signal at the output of the driver module 210. The calibration code obtained from the calibration phase is provided to the driver module 210 via signal lines 250, for use during the operation phase.

Figure 3:
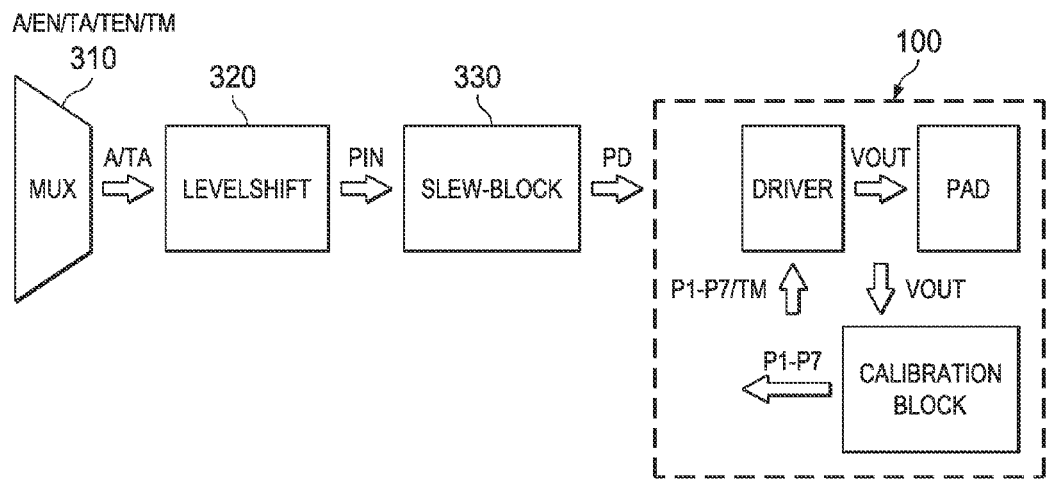
FIG. 3 shows a block diagram illustrating an implementation of the various modules of the adaptive buffer according to an example embodiment.

FIG. 3 shows a block diagram illustrating an implementation of the various modules of the adaptive buffer 100 according to an example embodiment. As shown in FIG. 3, a multiplexer (MUX) 310, a level shifter circuit 320, and a slew circuit 330 are coupled in series prior to the driver module 210. The MUX 310 is a standard multiplexer used in a normal I/O device. The input pins of the MUX 310 are configured to receive a sense-and-calibrate-mode signal TM, an input pulse A used in a non-sense-and-calibrate-mode (e.g., during normal mode), and a test-step input TA used in the sense-and-calibrate Mode. A value of TM=1 implies that the circuit is in the sense-and-calibrate mode, while the value of TM=0 implies that the circuit is in the non-sense-and-calibrate mode. The input pulse A has a frequency of about 75 MHz and a rise time of about 100 picoseconds (ps). The test step input TA also has a rise time of about 100 ps.

In an example implementation, the level shifter circuit 320 includes three standard level shifters (not shown), which are used to level shift the TM, NIN, and PIN signals coming from the MUX 310 respectively. The level-shifted signal of TM is called TMM. The slew circuit 330 is used to adjust the slew rate of the input going into buffer 100. It will be appreciated that the slew circuit 330 may be configured to operate for both the 54 ohm PVT driver and the final driver with the codes (FIG. 4).

Figure 4A:
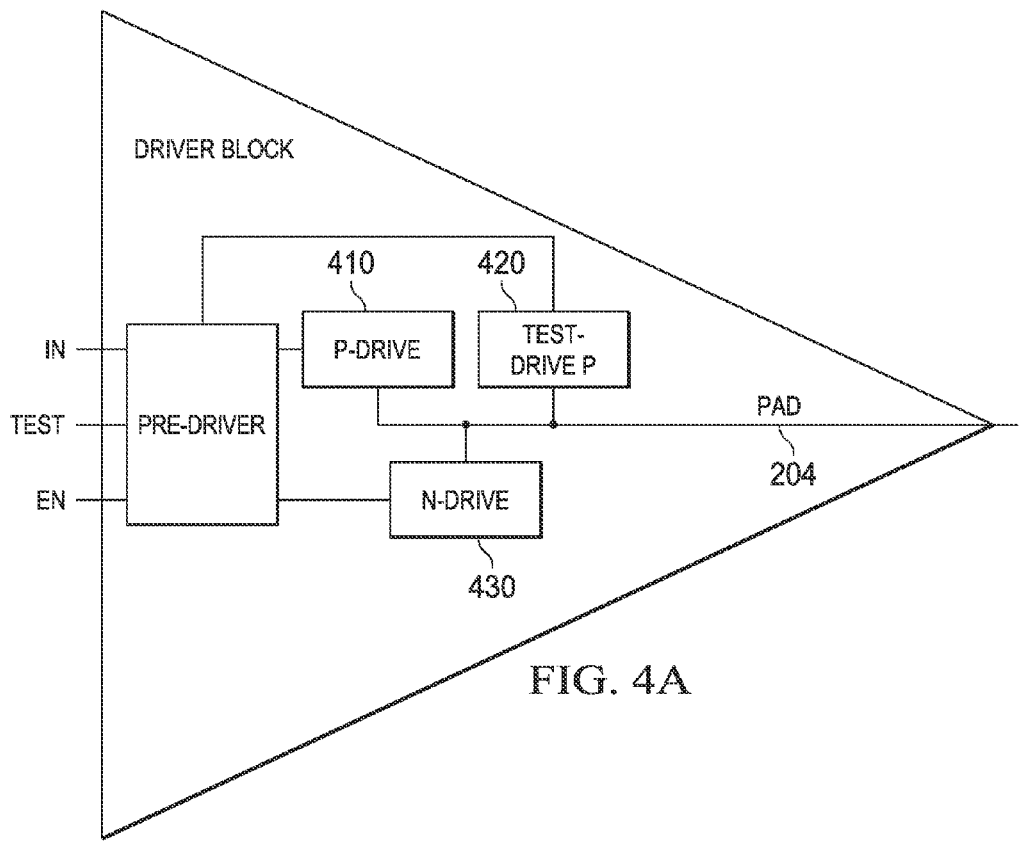
FIG. 4a shows a schematic diagram illustrating components of the driver module (block) according to an example embodiment.
Figure 4B:
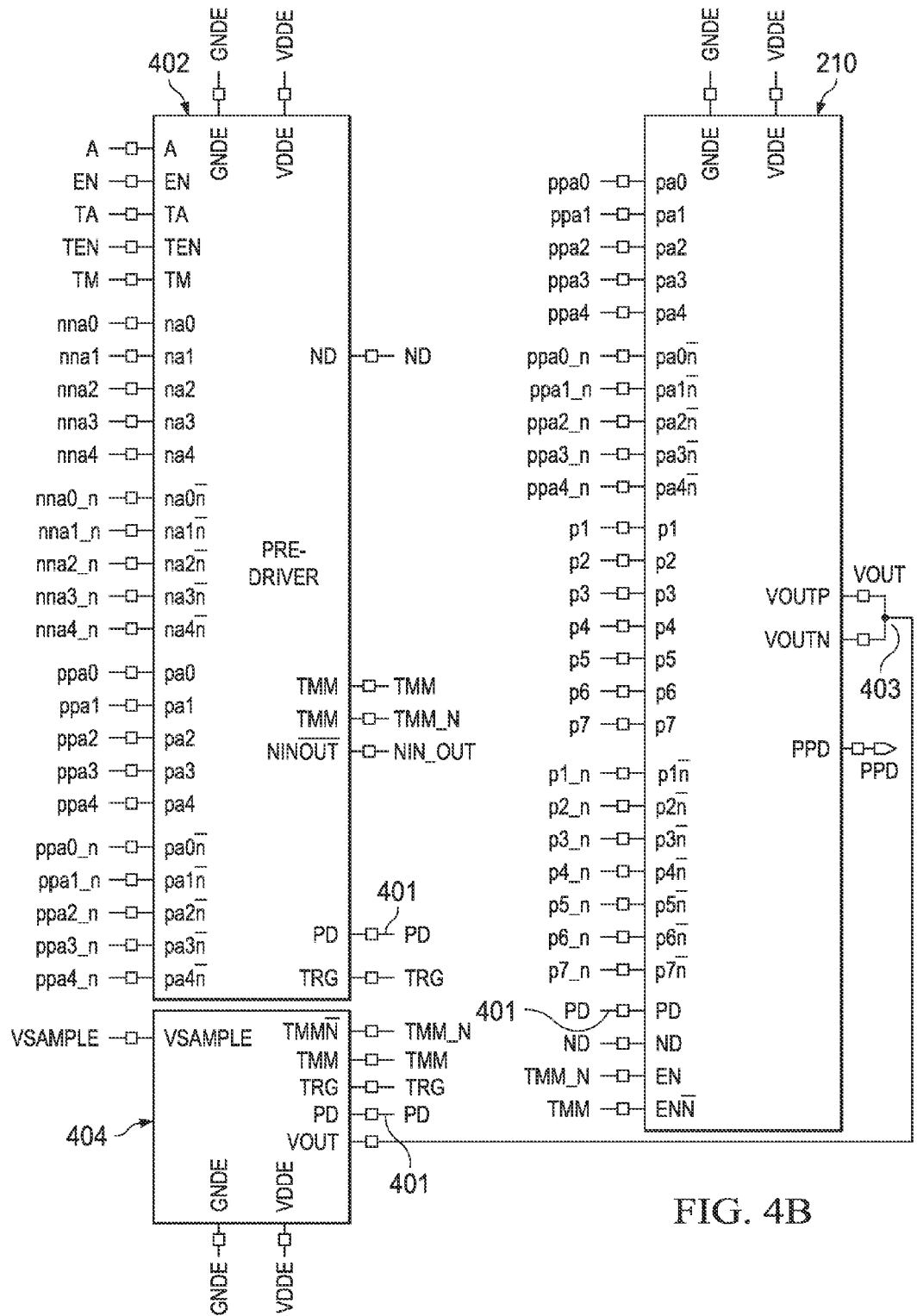

FIG. 4a shows a schematic diagram illustrating components of the driver module (block) 210 according to an example embodiment. FIG. 4b shows a circuit diagram illustrating connections between a pre-driver circuit 402 and the driver module 210 (where the predriver may be external to the driver module). A pre-driver signal PD 401 generated from the pre-driver circuit 402 is provided to the driver module 210. An output VOUT 403 of the driver module 210 is fed into the bootstrap circuit 404 of the receiver/sensor module 220 (FIG. 2), as shown in FIG. 4b.

Figures 1, 4C:
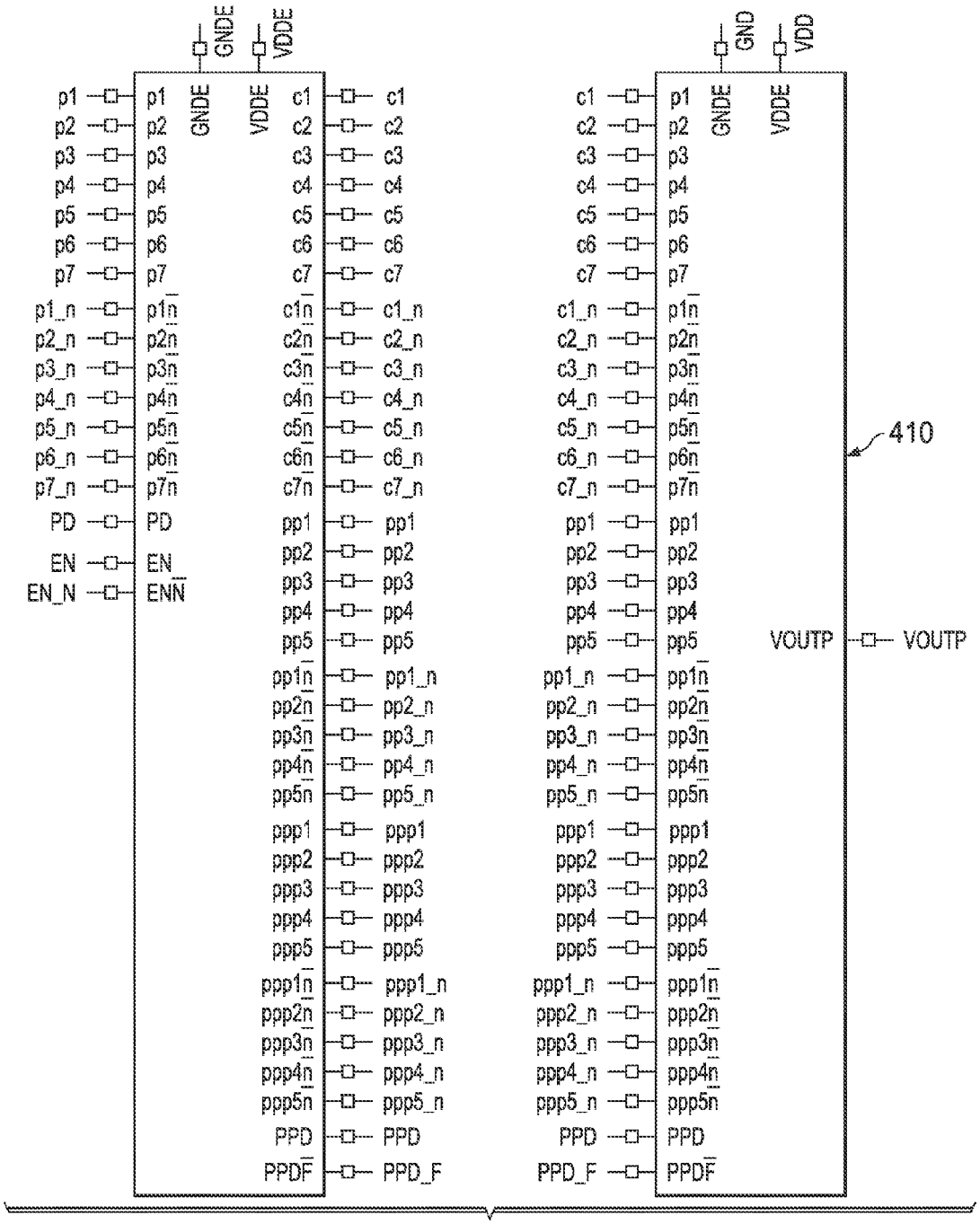
FIG. 4c shows a circuit diagram of the driver module of FIG. 4a in an example implementation.
Figures 2, 4C:
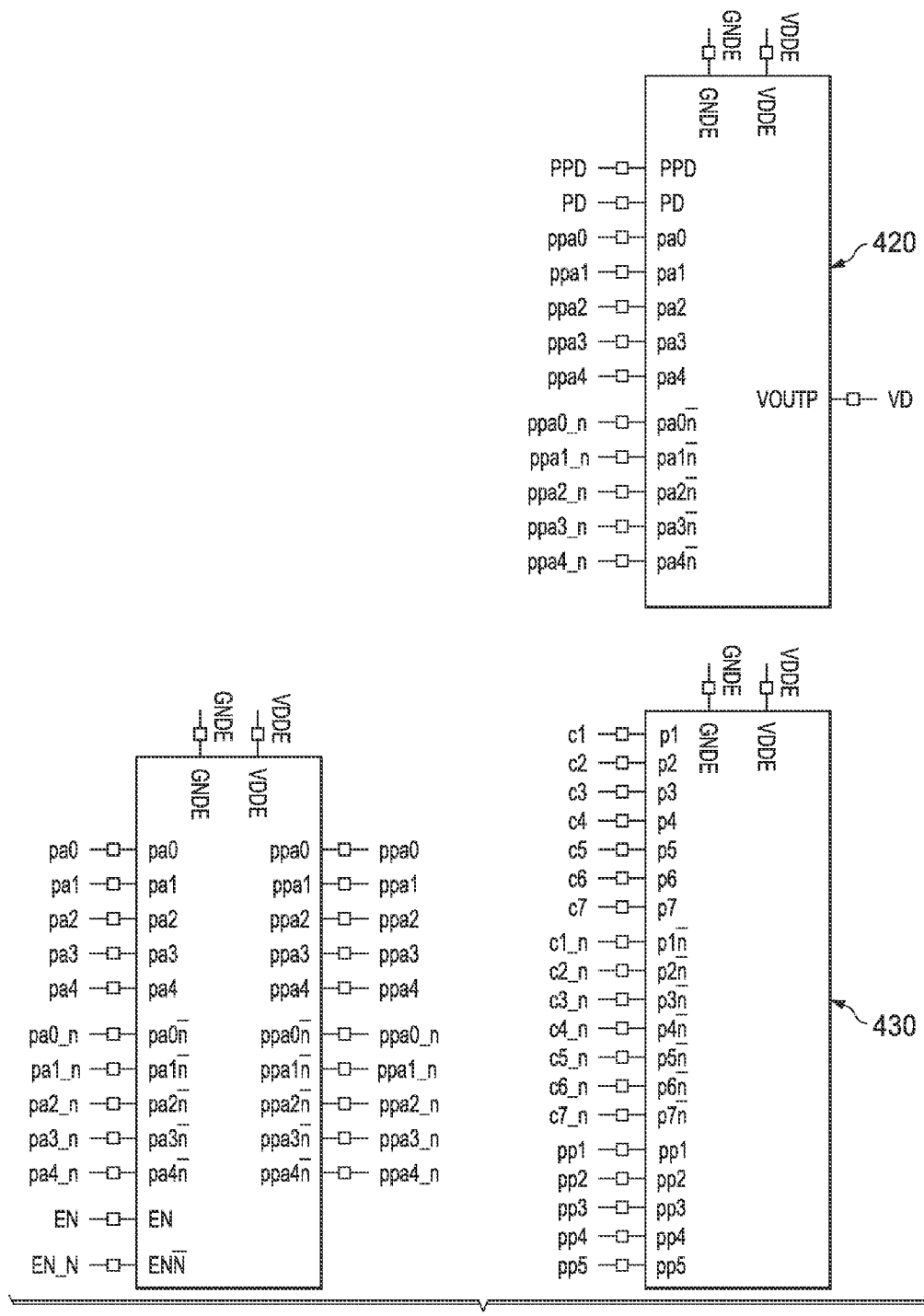

FIG. 4c shows a circuit diagram of the driver module 210 in an example implementation. With reference to FIGS. 4a and 4c, the driver module 210 includes two drivers having a common pull-down block 430 and different pull-up blocks 410, 420 respectively. For example, the driver used in the sense-and-calibrate mode has a 54-ohm pull-up block 420. The driver used in the non-sense-and-calibrate mode has a pull-up block 410 corresponding to the codes that are fed to it. The common pull-down is done taking into account the fact that only a falling pre-driver signal PD is fed to driver module 210 in the sense-and-calibrate mode, which will deactivate the pull-down block 430.

The driver module 210 has a standard push-pull architecture (single ended) in an example embodiment. Initially, the calibration code can be set to any default value. Through this principle the N block (pull-down) 430 of the driver module 210 is tuned/calibrated by first setting its impedance value equal to that of the transmission line, and then calibrating the P block (pull-up) 410 relative to this N calibrated block 430. This can be achieved through a similar structure as used for the calibration of the N block 430, or the codes for P may be derived from N simply by inverting them assuming an approximately perfect complimentary process variation of P-type transistors.

In an implementation of the above scheme, an adjunct pull-up block 420 is used, as shown in FIGS. 4a and 4c. The pull-up block 410 is compensated for process through a compensation code to have its impedance vary in the defined range of about 48-60 ohms in an example.

As described, in an embodiment, the driver stage 210 includes two pull-up blocks 410, 420 and one N-type pull-down block 430 configured in the push-pull inverter configuration for driving signals onto the pad 204. One of the pull-up blocks is of 54 ohms (typical) impedance, which is compensated by the PVT codes coming from the compensation block in the core. These can be standard 4-bit/7-bit codes given only to the 54 ohm pull-up block 420 just to stabilize the impedance around the mean of 54 ohms and having minimum variance. This helps in mathematical tractability of the solution to finding (delta_R2) (see Equation (1)), that is, the change in the value of the estimated transmission line's impedance as a function of the change in the pad's voltage and the resistance of the driver. As guided by analytical equations for maxima/minima, this may fetch the minimum error in determining the value of the line's impedance, and, hence, a more precise estimation of the line's impedance. The adjunct pull-up block 420 helps to implement the driver module 210 in a simpler and more precise way.

It will be appreciated that, in an alternate (and more basic) embodiment, the driver module 210 may be formed without the adjunct pull-up block 420. For example, the impedance at the driver module's output is configured as the parallel combination of scaled basic unit cells as described above, with the provision of calibration through the codes which, at the start-up of the circuit, are set to any default value. These impedance blocks are scaled for higher impedance in the calibration block with completely similar architecture for the emulated impedance with the same default code given to pull-up and pull-down blocks. When the unknown impedance is calibrated to the transmission line's impedance, the codes are automatically updated to estimate the impedance in the given range of operation. Such alternate embodiment may have a reduced accuracy of operation (about +/−18% maximum), but this method can calibrate to the given dynamic range of impedance variation.

As described, the 54-ohm pull-up block 420 is active only in the sense-and-calibrate mode. The configuration (e.g., in terms of percentage resistance contribution to the total resistance of the basic unit cell described above) for each arm may be 80% from the poly resistor and 20% from the MOS. It will be appreciated that the configuration may be varied in alternate embodiments. In an example embodiment, the 54 ohm PVT pull-up block 420 is used so as to minimize (i.e., compensate) the variation in the peak voltage of the output waveform across the process for a particular transmission line. In an embodiment, a constant resistance of the pull-up block 420 provides a controlled peak voltage for a particular impedance of the transmission line (TL) at all corners. As described, for this implementation, the 54-ohm block is PVT compensated through the compensation codes coming from the compensation block present in the core. This may imply more accuracy. It is found by calculations that a 54 ohm pull-up block can give the least error for a relatively large dynamic range, e.g., approximately 30-120 ohms ranged TL, hence such value has been implemented in an example embodiment.

The value of rate of change of estimated impedance of the transmission line with respect to the change in the output voltage can be found using Equation (1) below:

$$\frac{\partial r_2}{\partial v_o} = \frac{r_2}{v_o}\left(\frac{v_i}{v_i - v_o}\right) \quad (1)$$

where $\partial v_o$ is the change in voltage at the near end, $v_o$ is the output voltage VOUT at the near end of the transmission line at a particular time, $r_2$ is the transmission line's impedance, and $v_i$ is the input voltage to the voltage divider at the near end O/P formed between the driver's output impedance and transmission line's characteristic impedance. In the current scenario $v_i$ equals VDDE (the supply voltage for the complete buffer). This gives the error in calculation of the line's impedance given the error in measuring output voltage with a given accuracy. Because equation (1) can be derived from known equations that are used to model the behavior and characteristics of transmission lines, such derivation is omitted for brevity.

Figure 5A:
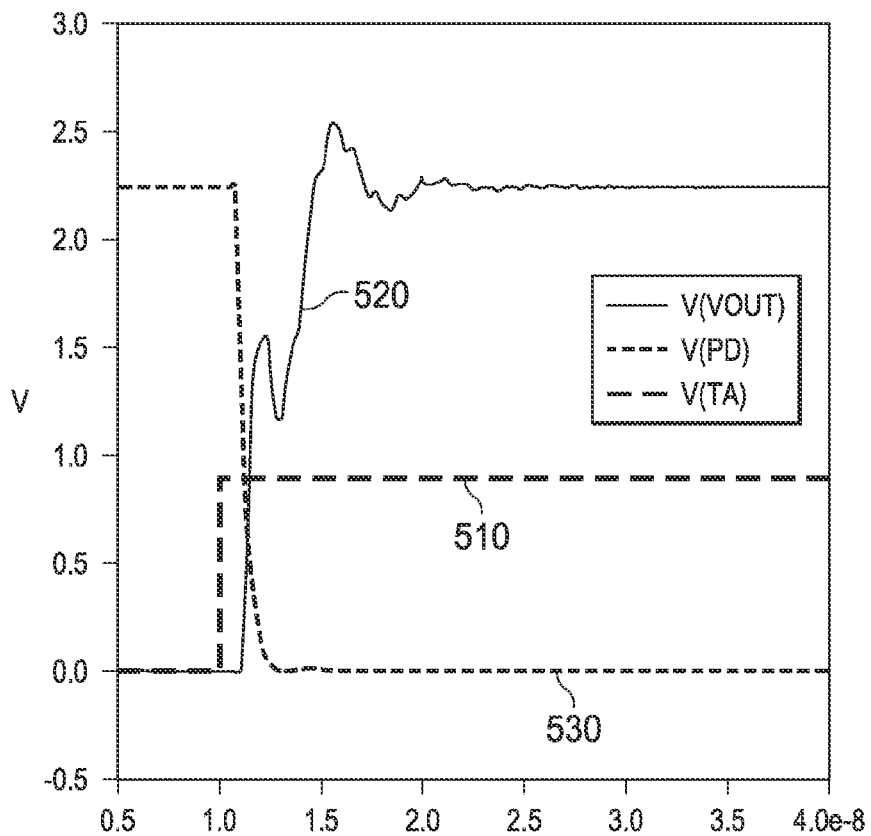
FIG. 5a shows a screen capture illustrating voltages in a Sense and Calibrate Mode according to an example embodiment.

FIG. 5a shows a screen capture illustrating voltages in a sense-and-calibrate mode according to an example embodiment. The test pulse TA, as shown by line 510, is given to the 54-ohm driver in the sense-and-calibrate mode. The corresponding output waveform VOUT, as shown by line 520, is generated with the help of the pre-driver signal PD, as shown by line 530. The first peak value in the above case is 1.57 Volts (V) for a 120-ohm TL at a 2.25V supply.

The output voltage VOUT can be calculated based on equation (2) below:

$$VOUT[1st \text{ peak value}] = \frac{\text{resistance}[TL]}{\text{resistance}[TL] + \text{resistance}[driver]} * VDDE \quad (2)$$

where VDDE is the supply voltage. If there is no peak in VOUT, then this means that the driver output impedance is matched to the combined impedance of the transmission line and load, and no adjustment of the driver output impedance is needed. Another way to think about this is that when the network that includes the driver, transmission line, and load is critically damped, then there is no peak in VOUT, and, therefore, the impedance of the output driver is matched to the combined impedance of the transmission line and capacitive load. Furthermore, if the load is a resistive load, then equation (2) holds at all times after the rise time of VOUT. Because equation (2) can be derived from known equations that are used to model the behavior and characteristics of transmission lines, such derivation is omitted for brevity.

Referring to FIGS. 4a and 4c, the final pull-up block 410 is active only in the non-sense-and-calibrate mode. This is the block where final latched codes are fed into, and the output wave of a good eye is produced ultimately. This block is also made of the same unit cell as described earlier with respect to the pull-up block 420. The block 410 is fed with the final 7-bit code for a particular TL (transmission line), which code will do the impedance matching.

The final pull-down block 430 is the common pull-down block which is also fed with the 7-bit code. However the pull-down block 430 is inherently inactive in the sense-and-calibrate mode as a pre-driver signal PD with falling edge is given, thereby deactivating the pull-down block 430, as described above. In the non-sense-and-calibrate mode, however, it will respond to the pulse given as the pre-driver signal PD. The pull-down block 430 has a similar architecture as the pull-up block 410, 420 in an example embodiment.

Figure 5B:
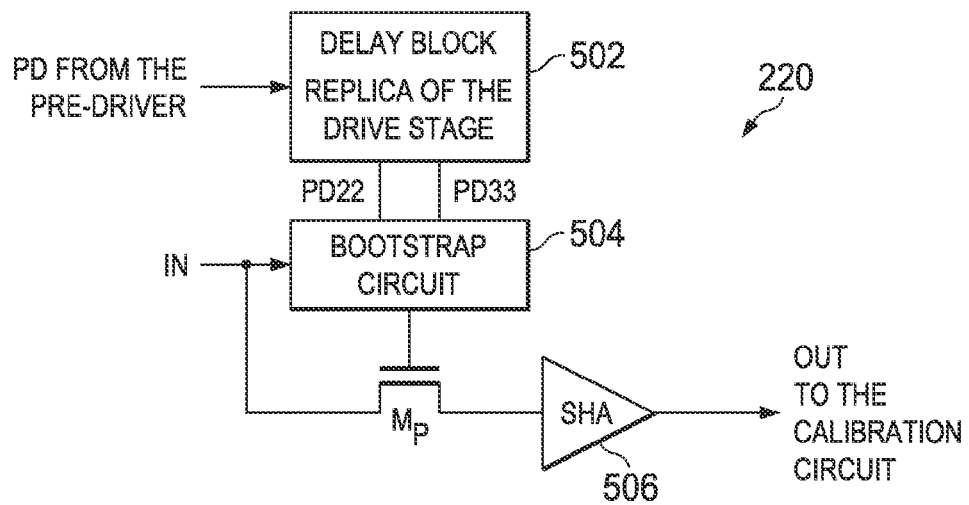
FIG. 5b shows a schematic diagram illustrating the sensor/receiver module according to an example embodiment.

Referring now to FIG. 2a, the sensor/receiver module 220 is active only during the sense-and-calibrate mode. The sensor/receiver module 220 is configured to sense and latch the first peak value of the output waveform (VOUT). The output from the pad 204 is fed to this module. FIG. 5b shows a schematic diagram illustrating the sensor/receiver module 220 according to an example embodiment. The sensor/receiver module 220 includes a sample logic block 502, which performs two functions: delay function and logic function. The delay function helps to set the trigger for the entire circuit. The characteristic of the architecture is used in setting the delay for the trigger signal to sample the PAD output voltage at the center. A replica circuit for the output stage generates the delay for the sampling edge with respect to the PD signal. This can avoid the use of high-precision timing generation circuits and synchronization to sample the voltage at the PAD at the required sampling instant.

In an example embodiment, the delay for the output driver is estimated (and generated through a delay function generator) based on the push-pull driver's architecture and given the dynamic range of the transmission line's impedance with respect to the PD signal, and hence generated through a cascade of scaled push-pull stages, to save area. In an example implementation, the pre-driver signal PD is used to obtain two trigger signals (PD22 and PD33), which will help in latching the peak value. This is accomplished through the generation of the two complimentary signals PD22 and PD33 from the pre-driver signal PD from the delay generation and logic block. These signals are fed to the bootstrap circuit 504. The logic function helps to prevent the block from being functional in the non-sense-and-calibrate mode (operation phase). In one implementation, this is performed by two transmission gates which act like switches. After the bootstrap circuit, the signals are stored on the sample-and-hold circuit/stage (SHA) 506, which includes a very-high gain-bandwidth product (GBW) op-amp in a closed loop with the hold capacitor (not shown in FIG. 5b). This stage can also provide noise immunity depending upon the bandwidth (BW) of the amplifier. As soon as the trigger pulses (PD22 and PD33) from the sample logic block are received, the peak value (VSAMPLE) of VOUT at the transmission-line input 204 (FIG. 2a) is stored on a capacitor.

Figure 5C:
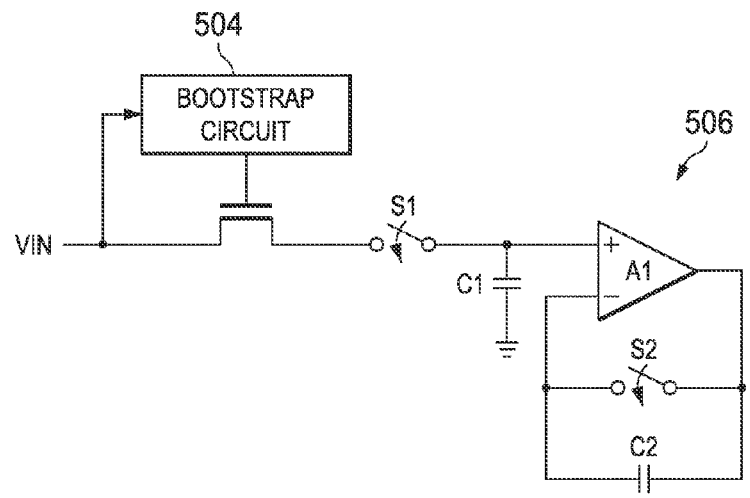
FIG. 5c shows a schematic diagram illustrating a sample-and-hold circuit according to an example embodiment.

FIG. 5c shows a schematic diagram illustrating the sample-and-hold circuit 506 described above according to an example embodiment. Here, switches S1 and S2 are used in conjunction with capacitors C1 and C2 for holding the sampled voltage, and amplifier A1 may be a high-speed/high-gain amplifier. Further, as can be seen from FIG. 5c, the bootstrap circuit 504 is coupled prior to the sample-and-hold circuit 506.

Figure 5D:
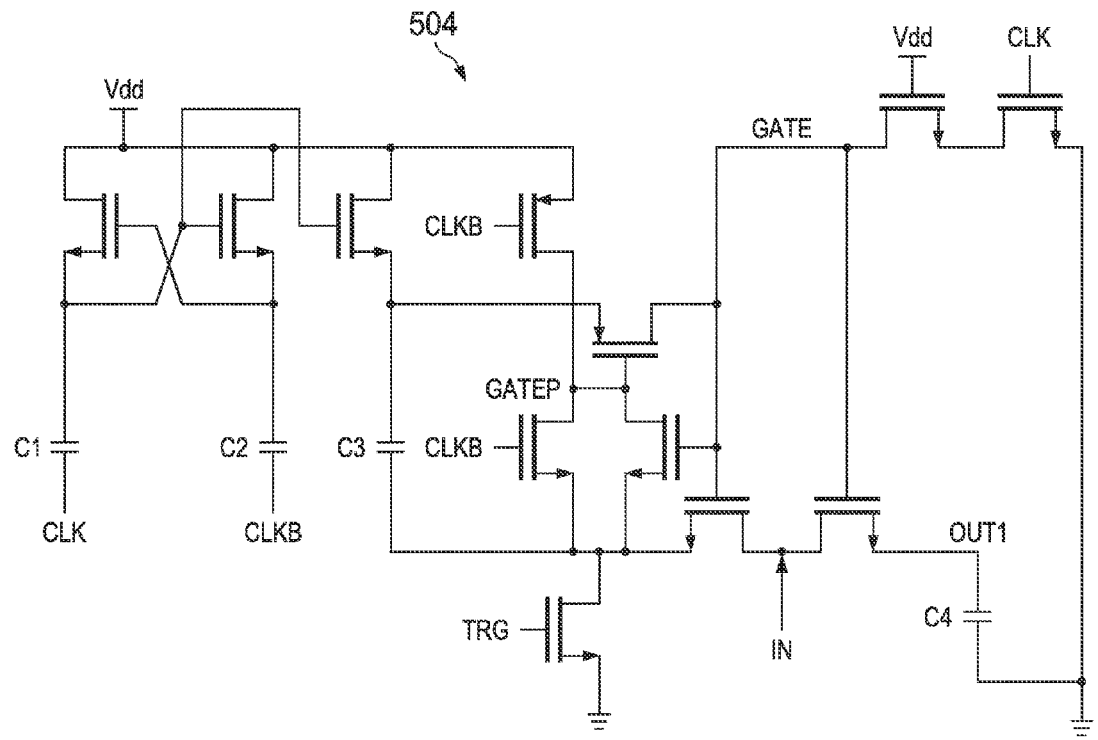
FIG. 5d shows a schematic diagram illustrating a bootstrap circuit according to an example embodiment.

FIG. 5d shows a schematic diagram illustrating the bootstrap circuit 504 according to an example embodiment. Various components of the bootstrap circuit 504, such as gates, clock inputs CLK, CLKB, and capacitors C1-C4 may be conventional.

Figure 6A:
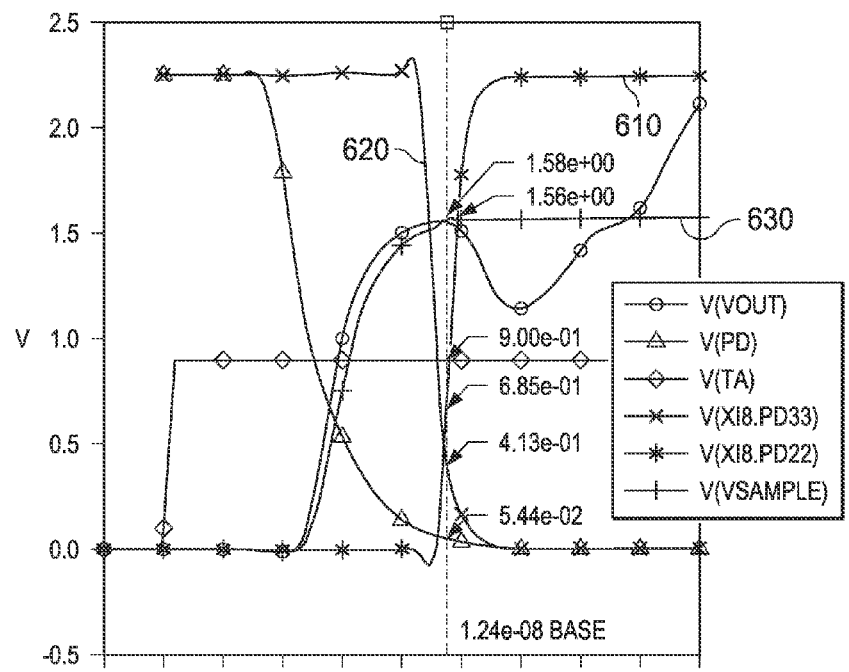
FIG. 6a shows a screen shot illustrating the trigger signals and in the sense-and-calibrate mode according to an example embodiment.

FIG. 6a shows a screen shot illustrating the trigger signals PD22 and PD33 in the sense-and-calibrate mode according to an example embodiment. As described, the signals PD22 and PD33, as shown by lines 610 and 620 respectively, are the delayed signals of the pre-driver signal PD, and are used to clock the control block, and thus to sample the voltage with good accuracy. PD22 and PD33 are generated from the signal PD, which also drives the output stage of the complete buffer. A stage similar in architecture to the output driver is used to generate the sampling edge by PD22 and PD33. This delay stage includes tapered buffers, which architecturally replicate the output driver for loading, etc., and are driven by the same input signal synchronously (PD and ND) that generates the sampling edges in the requisite time band. The errors due to mismatch and loading are tolerated with in this time band of the first maxima of the launched voltage. As can be seen in FIG. 6a, the value of VSAMPLE, as shown by line 630, is constant after the trigger point.

Figure 6B:
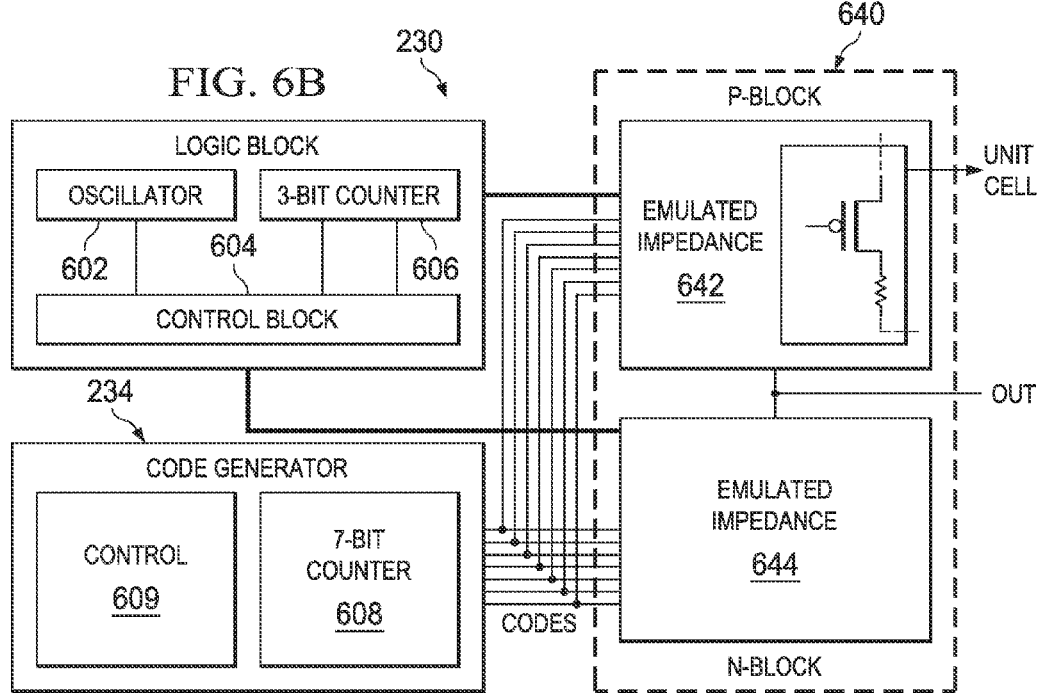
FIG. 6b shows a block diagram illustrating components of the calibration module according to an example embodiment.
Figure 6C:
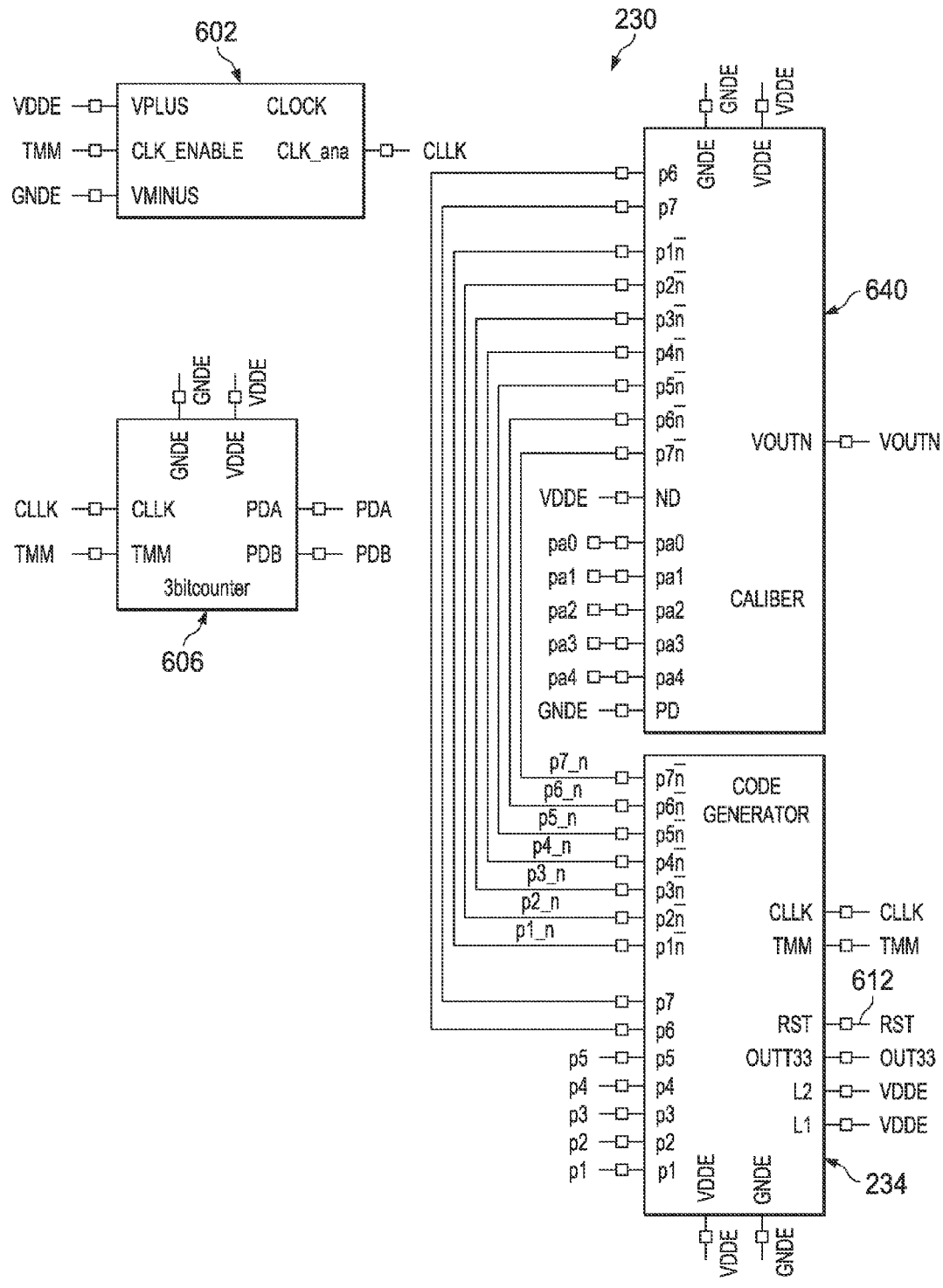
FIG. 6c shows a circuit diagram of the calibration module of FIG. 6b in an example implementation.
Figure 6D:
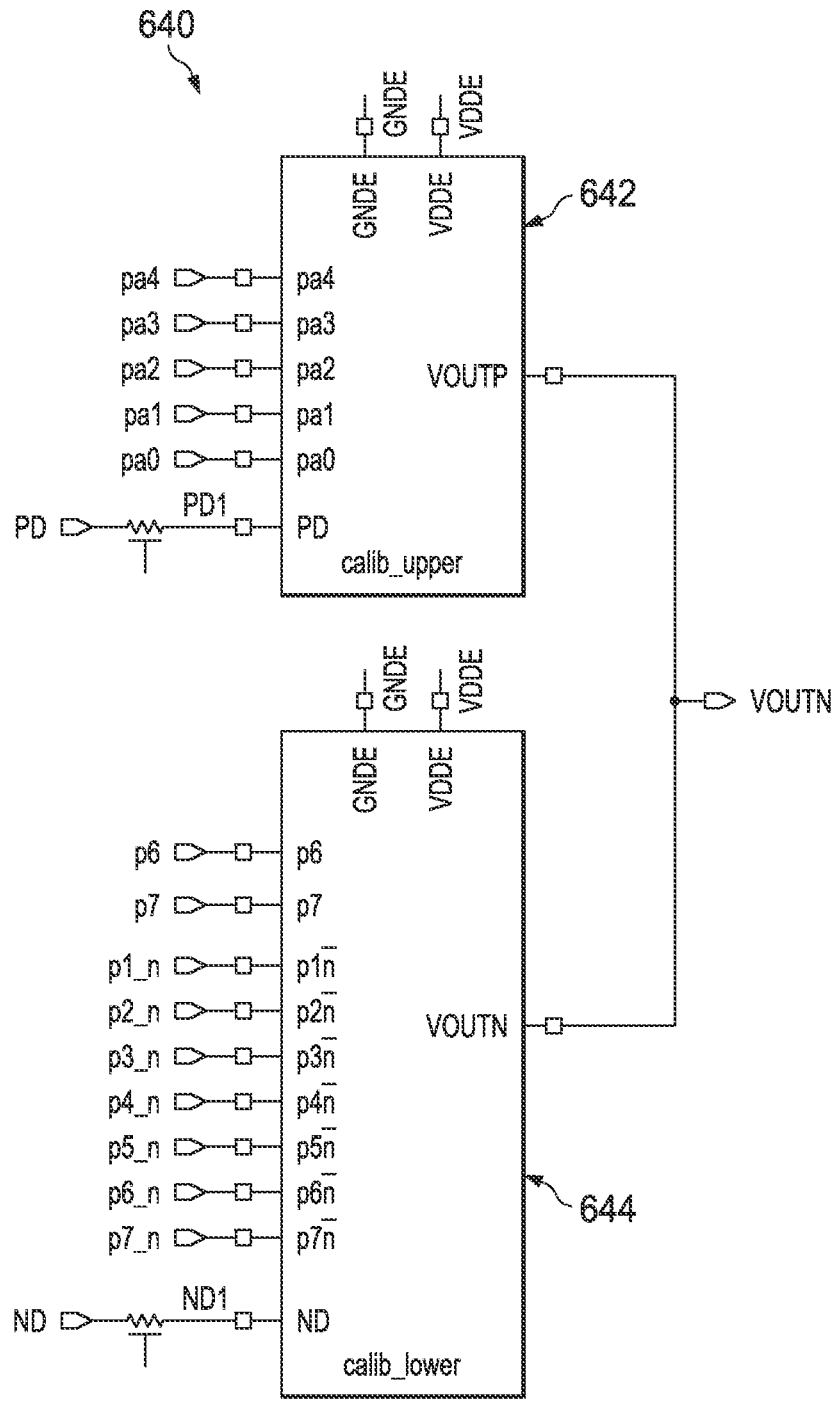
FIG. 6d shows a circuit diagram illustrating the pull-up and pull-down blocks in a calibration circuit of the calibration module according to an example embodiment.
Figure 6E:
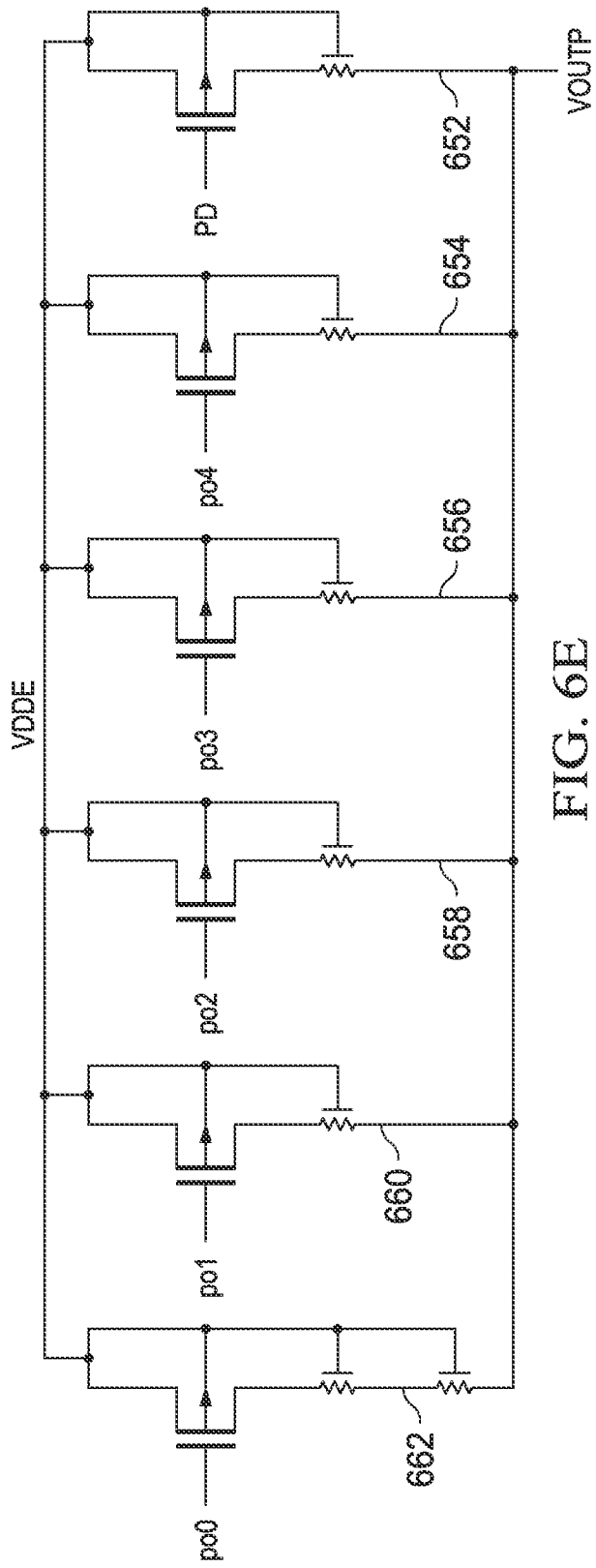
FIG. 6e shows a circuit diagram illustrating components of the pull-up block of FIG. 6d according to an example embodiment.

FIG. 6b shows a block diagram illustrating components of the calibration module 230 (FIG. 2) according to an example embodiment. FIG. 6c shows a circuit diagram of the calibration module 230 of FIG. 6b in an example implementation. FIG. 6d shows a circuit diagram illustrating the pull-up and pull-down blocks in a calibration circuit of the calibration module 230 in an example implementation. FIG. 6e shows a circuit diagram illustrating components of the pull-up block in FIG. 6d according to an example embodiment.

As shown in FIGS. 6b and 6c, the calibration module 230 includes sub-blocks, which are enabled in the sense-and-calibrate mode (calibration phase). The codes for the corresponding TL are generated and latched here, and are later fed to the driver (FIG. 4) in the non-sense-and-calibrate mode. To reset an existing calibration, a reset input signal RST 612 (FIG. 6c) is given to the calibration module 230 externally by the user. For example, a low to high step input (0-VDDE) is provided at the end of each cycle, which includes the calibration phase (sense-and-calibrate mode) and operation phase (non-sense-and-calibrate mode). The reset pulse RST 612 clears the flip-flops of the 7-bit code to zero, thereby making all codes zero before a sense-and-calibrate mode is started. Another reset pulse RST 612 is provided on the next sense-and-calibrate mode, i.e., after the current non-sense-and-calibrate mode.

For example, the calibration module 230 includes a ring oscillator 602 (FIG. 6b) configured to generate a clock signal CLLK having a period TP varying from 13 nanosecond (ns) to 30 ns across all PVT conditions only after the sense-and-calibrate mode is activated. FIG. 7 shows a screen capture illustrating generation of a clock signal CLLK, as shown by line 710 according to an example embodiment. As can be seen in FIG. 7, the clock signal 710 only starts after the phase shifted sense-and-calibrate-mode signal TMM_N, as shown by line 720, is triggered.

In addition, the calibration module 230 includes a tracking/control block 604 (FIG. 6b) containing the track-and-hold circuit (SHA Block) of the sampled voltage (VSAMPLE) coming from the bootstrap circuit. The op-amp in the tracking/control block 604 is activated as soon as the sense-and-calibrate mode is activated. FIG. 8 shows a screen capture illustrating behavior of an output OUTCS of the op-amp according to an example embodiment. This output OUTCS, as shown by line 810, tracks the sampled voltage VSAMPLE, as shown by line 820.

The calibration module 230 further includes a bit counter 606 (FIG. 6b) configured to generate '4*TP' (i.e., the estimated time for the settling of the sampled voltage at the output of the track and hold circuit SHA, where TP is the clock period for the oscillator deployed for generating the requisite delay) delayed signals PDA and PDB with respect to the first clock edge, which activate the comparator (which eventually triggers another counter for latching the codes). The delay in the signals is desirable to help the track circuit settle to the peak value, which is fed to a comparator 232 (FIG. 2b). The comparator 232 is triggered by the signals PDA 236 and PDB 236 (FIG. 2b) after the sampled voltage is held. It compares the sampled value so as to latch the codes when sample is detected. FIG. 9 shows a screen capture illustrating generation of the delayed signals PDA and PDB according to an example embodiment. It can be seen from FIG. 9 that the delayed signals PDA and PDB, as shown by lines 910 and 920 respectively, are triggered after the 4th clock edge of the clock signal CLLK, as shown by line 930, which enables the comparator 232, thereby enabling its output OUT33, as shown by line 940, to go high.

Figure 10:
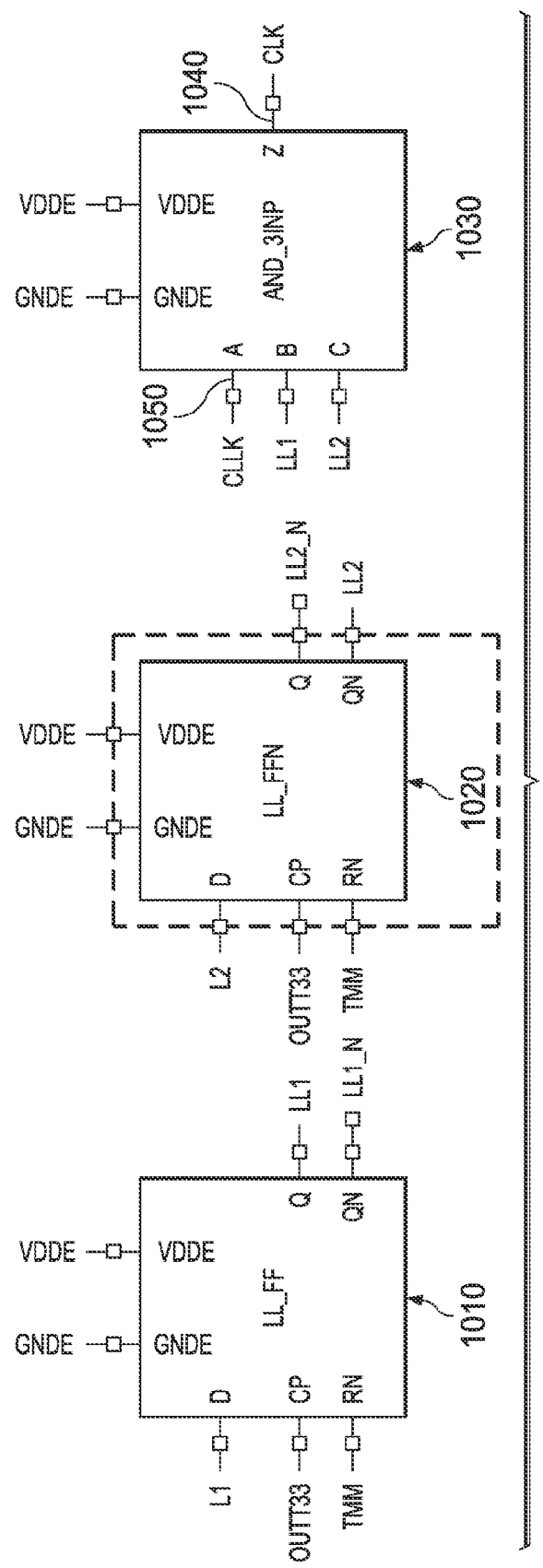
FIG. 10 shows a schematic diagram illustrating two flip-flops and an AND gate configured for use in an example embodiment.

With further respect to FIGS. 6b and 6c, the calibration module 230 includes a code generator 234 (FIG. 2), which is the logic heart of the calibration module 230. The code generator 234 includes 2 sub-blocks including a counter 608 and a logic generator 609. The logic generator 609 is configured to generate a clock signal CLK only after the comparator 232 is enabled and to deactivate the clock signal after the comparator 232 detects the sampled value. The logic generator 609 uses a positive-edge 1010 and a negative-edge flip-flop (FF) 1020 and an AND gate 1030 (shown in FIG. 10). The input to the logic generator 609 is the clock CLLK from the clock generator 602 and the output generated is a logic controlled clock signal CLK 1040 (FIG. 10). Calibration stops when this clock is disabled.

FIG. 10 shows schematic diagram illustrating two flip-flops 1010, 1020 and an AND gate 1030 configured for use in an example embodiment. Here, flip flop LL_FFN 1010 is a negative edge flip-flop, and flip-flop LL_FF 1020 is a positive-edge flip-flop. L1 and L2 are both logic high signals. It will be appreciated that the above arrangements may be changed in alternate embodiments. When the signal TM is 0, both flip flops 1010, 1020 are reset and the clock signal CLK 1040 is disabled. When output OUT33 of the comparator rises (first rise), when the comparator is enabled, the clock signal CLK 1040 is activated, i.e., it follows the clock CLLK 1050. Hence, the comparator 232 detects the peak (when VOUTN=sample value), the output OUT33 of comparator falls (first fall), thereby disabling the clock as signal LL2 will be zero. This logic is implemented to prevent multiple triggering of the comparator 232 in a noisy environment which may create errors in implementation.

In an example embodiment, the counter 608 includes a 7-bit counter. The controlled clock signals are fed to the counter 608, which keeps generating a 7-bit code in an incrementing order until the clock signal is deactivated, i.e., the sample value is detected, and the codes are latched. The counter 608 is enabled for both the test (sense-and-calibrate) and the non-sense-and-calibrate modes. As described, a reset signal RST is provided externally, and is triggered at the beginning of each cycle of detection and implementation of the codes. The reset signal RST is used to reset the flip-flops of the 7-bit counter 608 to zero before the start of the next sense-and-calibrate mode and after the end of the current non-sense-and-calibrate mode.

Referring to FIGS. 6b-6d, the calibration circuit 640 has a pull-up block 642 and a pull-down block 644 scaled by a factor of 10-100 to imitate the driver module's impedance, with the provision for calibration through the codes both in the pull-up and pull-down blocks. In this implementation, the calibration circuit 640's pull-up block 642 is a scaled implementation of 54 ohm (with no provision for calibration) and the pull-down block has the same structure as that for the driver module's impedance.

In an example implementation, the calibration circuit 640 is a simple resistor divider circuit configured to mimic an analog-to-digital converter (ADC). The calibration circuit 640 contains 2 blocks, the pull-up block 642 and the pull-down block 644. The pull-up block 642 includes a 540 ohm PVT compensated block to imitate the 54 ohm pull up block of the driver in FIG. 4 (multiplied by 10 to reduce the area). The pull down block 644 is a binary-configured resistor whose resistance changes with respect to the codes from the counter 608. The resultant output voltage VOUTN produced by the calibration block 640 is seen as steps, which keeps increasing until VOUTN reaches the sample voltage at which point the codes are latched. For example, the output voltage VOUTN is compared with the sample voltage VSAMPLE by the comparator 232.

Referring to FIG. 6e, the switches are configured to operate with the desired codes to emulate the required impedance. The unit cells of the impedance block are scaled and coupled in parallel to emulate the driver's impedance. In one implementation, the maximum currents at nodes 652, 654, 656, 658, 660 and 662 are 4 milliamperes (mA), 2 mA, 1 mA, 0.5 mA, 0.25 mA, and 0.125 mA respectively.

Figure 11:
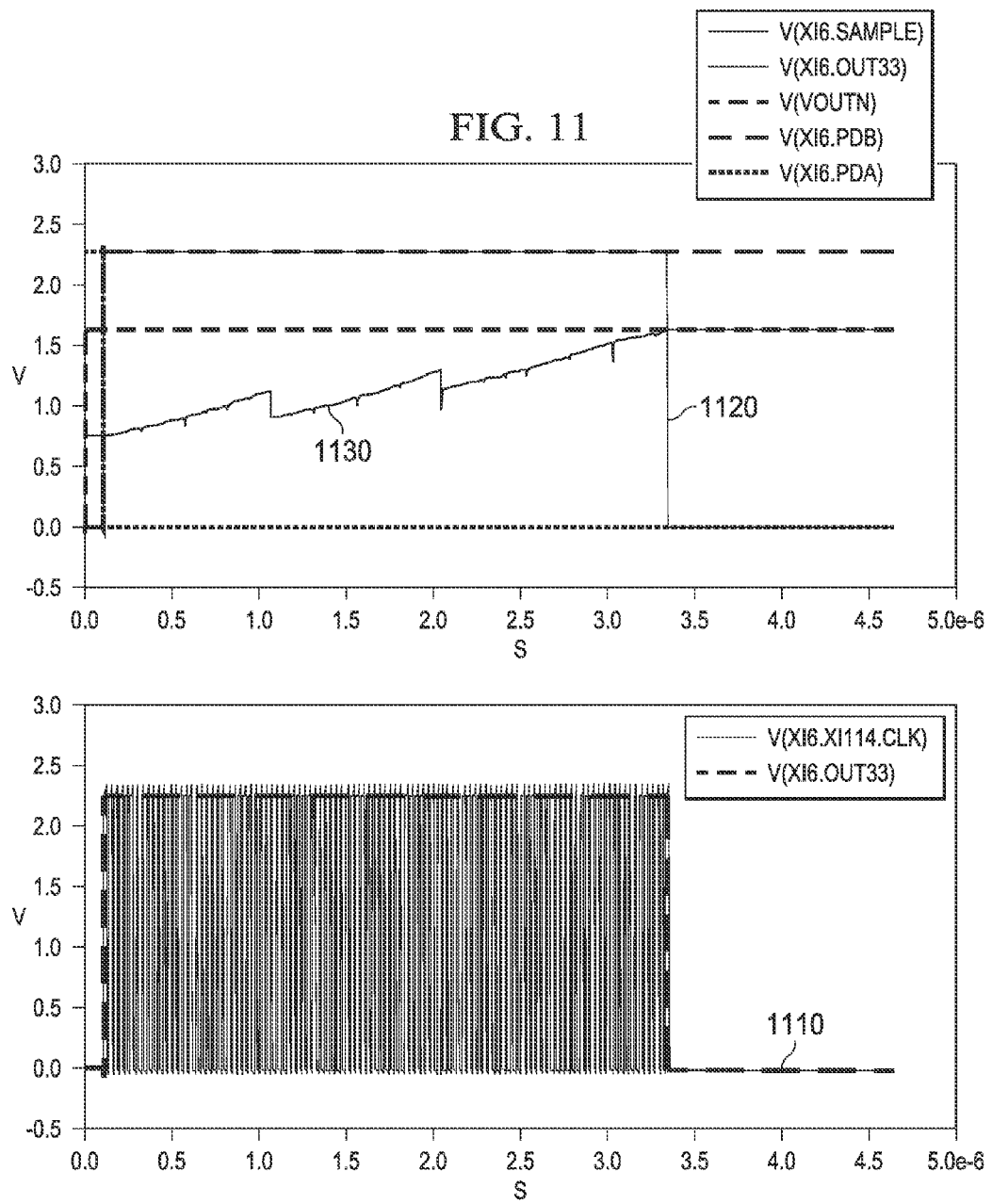
FIG. 11 shows a screen capture illustrating generation of the clock signal according to an example embodiment.
Figure 12A:
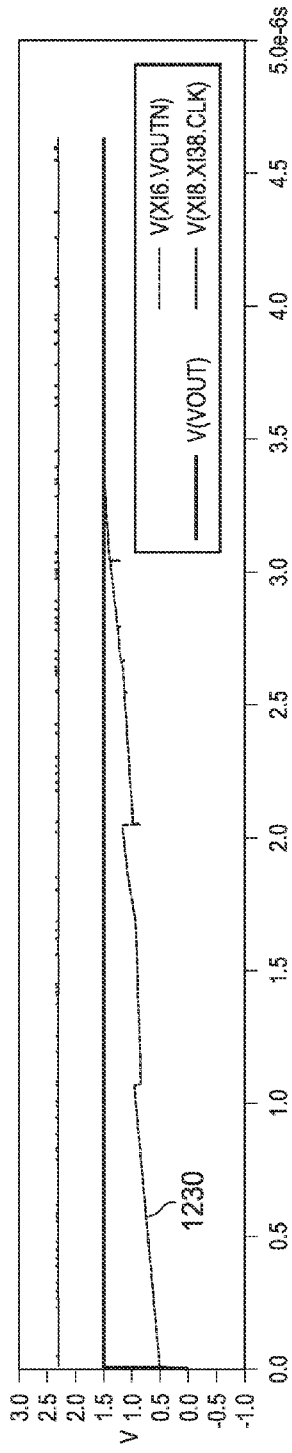
FIG. 12 shows a screen capture illustrating latching of the codes according to an example embodiment.
Figure 12B:
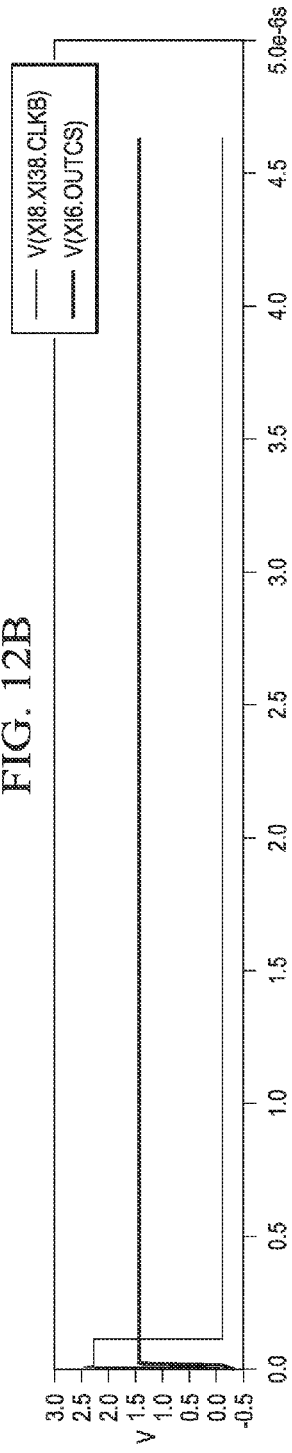
Figure 12C:
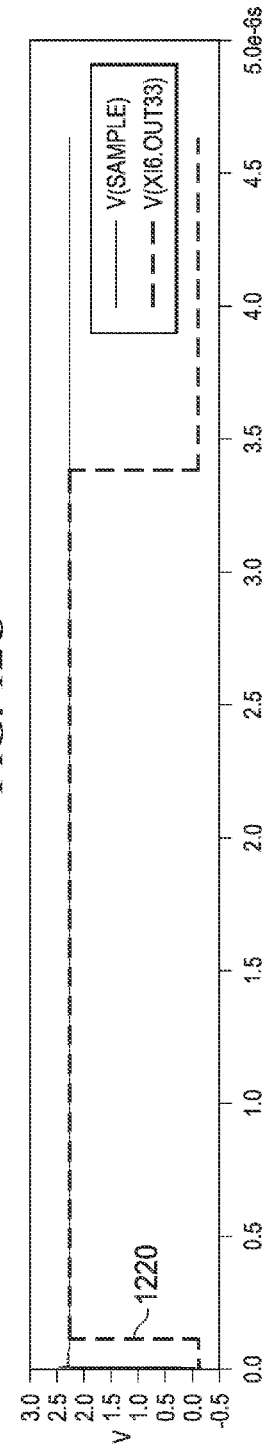
Figure 12D:
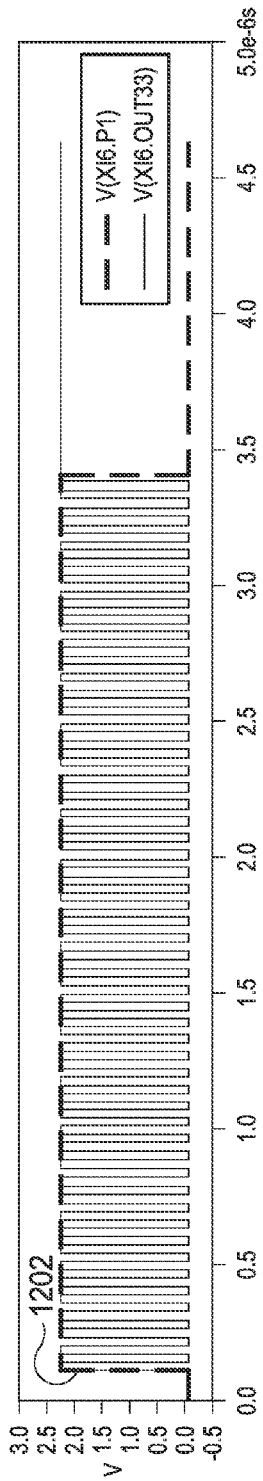
Figure 12E:
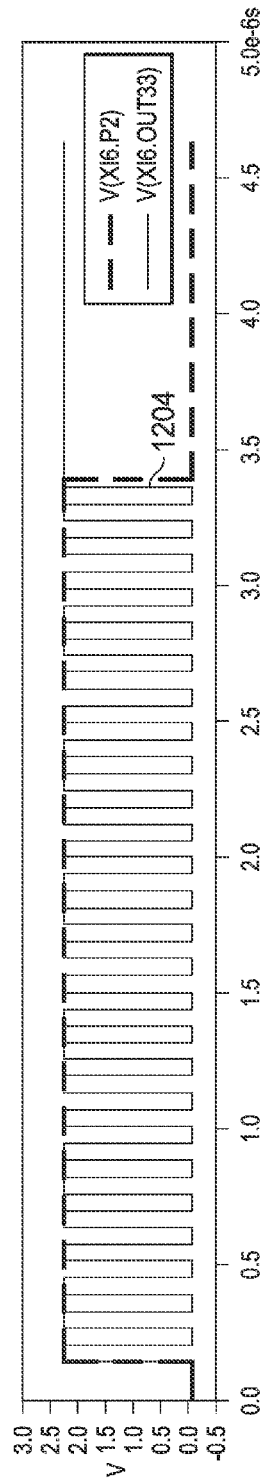
Figure 12F:
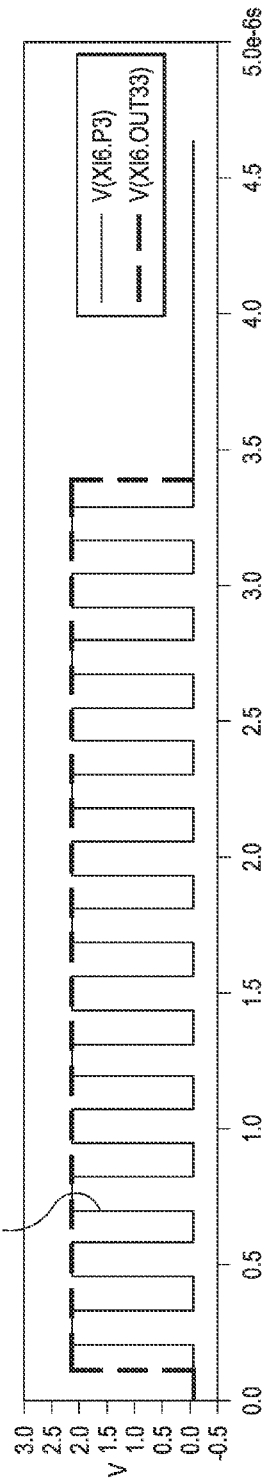
Figure 12G:
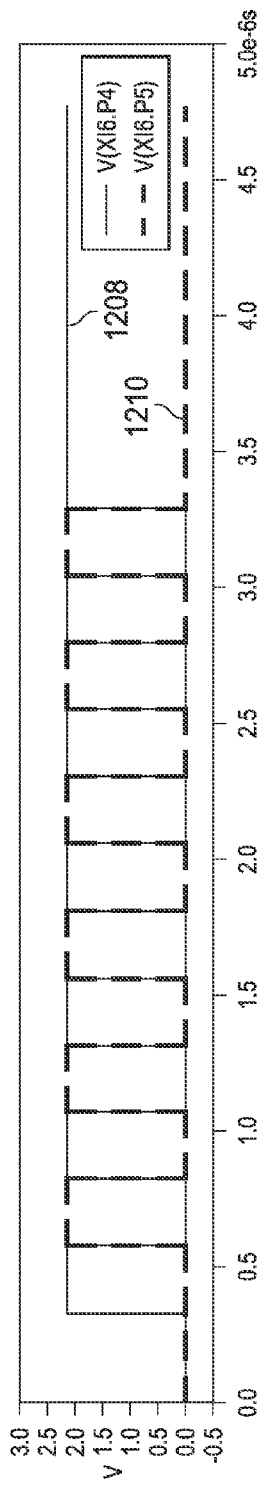
Figure 12H:
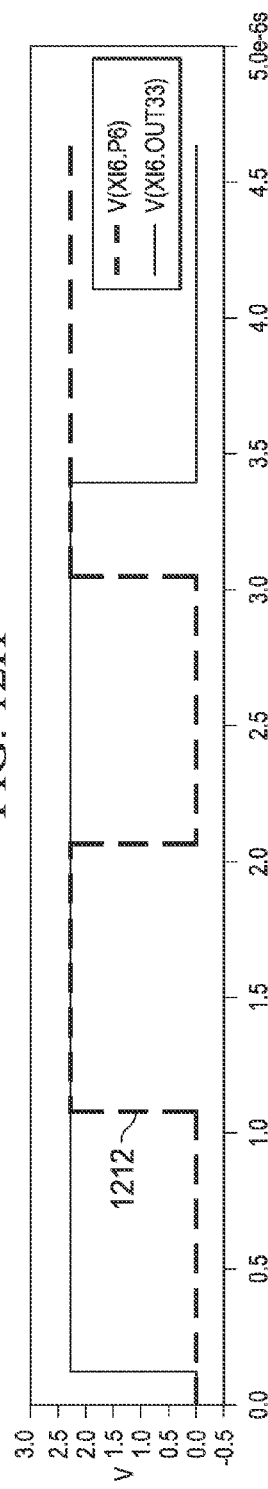
Figure 12I:
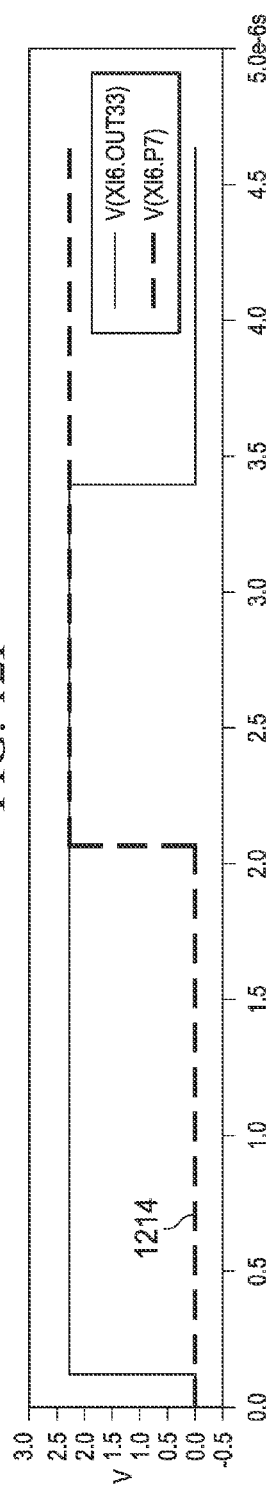

FIG. 11 shows a screen capture illustrating generation of the clock signal CLK. The objective is to generate a clock signal (CLK) only after the comparator is enabled, and to deactivate the clock signal after the comparator detects the sample value. The block uses a positive and a negative edge FF and an AND gate. The input to the block is the clock from the clock generator (CLLK) and the output generated is a LOGIC-CONTROLLED CLOCK (CLK) signal. Calibration stops when this clock is disabled according to an example embodiment. It can be seen that the controlled clock signal CLK, as shown by line 1110, is triggered only after the output signal OUT33, as shown by line 1120, from the comparator 232 is enabled, and the clock signal CLK is disabled as soon as the comparator output OUT33 is switched again (the codes are latched at this point). A signal VOUTN, as shown by line 1130, which is the output of a calibration circuit, is seen increasing in steps.

FIG. 12 shows a screen capture illustrating latching of the codes according to an example embodiment. The codes P1-P7, as represented by lines 1202, 1204, 1206, 1208, 1210, 1212 and 1214 respectively, are latched as soon as the comparator detects that the sample value VSAMPLE, as represented by line 1220, is matched to the output VOUTN, as represented by line 1230, of the calibration circuit 640 (FIG. 6d). The same time scale (horizontal axis) is used for the various graphs. As can be seen in FIG. 12, the lines 1202, 1204, 1206, 1208, 1210, 1212, and 1214 have progressively longer pulses.

Figure 13:
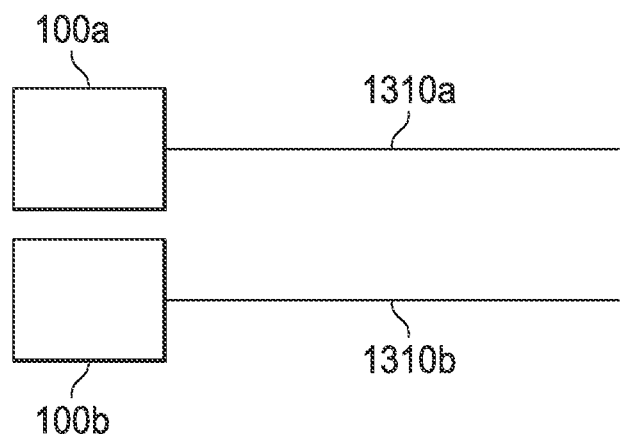
FIG. 13 shows a block diagram illustrating a low-voltage differential-signaling system using a buffer according to an example embodiment.

FIG. 13 shows a block diagram illustrating a low-voltage differential signaling (LVDS) system 1300 that employs the buffer as described according to an example embodiment. The LVDS system 1300 includes a pair of transmission lines 1310a, 1310b, at least one of which is coupled to the buffer 100 (FIG. 1). In an embodiment, each of the transmission lines 1310a, 1310b is coupled to a respective buffer 100a, 100b, as shown in FIG. 13. In an example embodiment using such a buffer, it is possible to calibrate the drive impedance or the termination impedance at either side of the LVDS system depending upon the architecture used. It will be appreciated that in other applications, e.g., a high-speed link, a single transmission line may be used in place of the pair of transmission lines 1310a, 1310b, similar to what is shown in FIG. 1.

While this detailed description has set forth some embodiments, other embodiments may differ from the described embodiments according to various modifications and improvements. For example, the counter can increment the codes in increasing or decreasing manner; the relevant impedance values may be varied based on actual requirements, etc.

Within the appended claims, unless the specific term "means for" or "step for" is used within a given claim, it is not intended that the claim be interpreted under 35 U.S.C. 112, paragraph 6.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated. Moreover, elements in one embodiment may be combined with elements of one or more other embodiments to generate additional embodiments.

The invention claimed is:
1. A circuit, comprising:
 a node configured to be coupled to a signal-propagation medium, the signal-propagation medium having an impedance;
 a driver having an adjustable output impedance and configured to drive a test signal onto the node;
 a receiver configured to sense the test signal at a near end of the signal-propagation medium; and a calibrator coupled to the node and comprising:
an emulated impedance stage configured to emulate the impedance of the signal-propagation medium,
a comparator configured to compare the test signal as sensed at a near end of the signal-propagation medium prior to arrival of a reflection of the test signal off a far end of the signal-propagation medium to a voltage from the emulated impedance stage, and
a code generator configured to generate, in response to the comparison between the sensed test signal as sensed and the voltage from the emulated impedance stage, an impedance signal that is related to the impedance of the signal-propagation medium;
said driver further configured to adjust its output impedance of the driver in response to the impedance signal.

2. The circuit of claim 1 wherein the node includes an output node.

3. The circuit of claim 1 wherein the node includes an input node.

4. The circuit of claim 1, wherein the receiver has an input impedance and is configured to adjust the input impedance in response to the impedance signal.

5. The circuit of claim 1, further comprising a transmitting stage coupled to the node, having an output impedance, and configured to adjust the output impedance in response to the impedance signal.

6. The circuit of claim 1 wherein the driver includes driver elements that are selectively activated in response to the impedance signal to adjust the output impedance of the driver.

7. The circuit of claim 1 wherein the driver is configured to set the output impedance approximately equal to the impedance of the signal-propagation medium in response to the impedance signal.

8. The circuit of claim 1, further comprising a transmitting stage coupled to the node, having an output impedance, and configured to set the output impedance approximately equal to the impedance of the signal-propagation medium in response to the impedance signal.

9. The circuit of claim 1 wherein the calibrator is configured to provide the impedance signal to a remote circuit that is coupled to the signal-propagation medium.

10. A system, comprising:
a node configured to be coupled to a load that includes a signal-propagation medium, the load having an impedance;
a transmitter having an output impedance and configured to provide an outgoing signal to the node;
a receiver having an input impedance and configured to receive an incoming signal from the node;
a driver configured to provide a calibration signal to the node;
a first calibrator coupled to the node and configured to cause the output impedance to approximately equal the impedance of the load in response to the calibration signal; and
a second calibrator configured to set the input impedance of the receiver in response to the calibration signal.

11. The system of claim 10 wherein the first calibrator is also configured to set the input impedance of the receiver in response to the calibration signal.

12. The system of claim 10 wherein the driver forms part of the transmitter and is configured to provide the outgoing signal to the node.

13. The system of claim 10, further comprising the signal-propagation medium.

14. The system of claim 13 wherein the signal-propagation medium includes a transmission line.

15. The system of claim 10, further comprising the signal-propagation medium and the load.

16. The system of claim 15 wherein the load includes a capacitive load.

17. A system, comprising:
first and second nodes configured to be coupled to a load including a signal-propagation medium, the load having a differential impedance;
a transmitter having a differential output impedance and configured to provide a differential outgoing signal to the nodes;
a receiver having a differential input impedance and configured to receive a differential incoming signal from the nodes;
a driver configured to provide a differential calibration signal to the nodes; and
a calibrator coupled to the nodes and configured to receive the calibration signal from the nodes and to cause the differential output impedance to approximately equal the differential impedance of the load in response to the calibration signal.

18. The system of claim 17 wherein the driver is configured to provide the differential calibration signal to the nodes by:
providing a first component of the differential calibration signal to the first node; and
providing a second component of the differential calibration signal to the second node.

19. A method, comprising:
receiving a calibration signal on a node that is coupled to a load that includes a signal-propagation medium, the load having an impedance; and
adjusting an impedance of a circuit coupled to the node in response to the calibration signal by:
generating a sample of the calibration signal at a point where the slope of the calibration signal is approximately zero,
generating a comparison signal with a calibration impedance,
comparing the sample to the comparison signal,
adjusting the calibration impedance such that the comparison signal approximately equals the sample, and
adjusting the impedance of the circuit in response to the adjusted calibration impedance.

20. The method of claim 19 wherein adjusting the impedance of the circuit in response to the adjusted calibration impedance comprises setting the impedance of the circuit approximately equal to the adjusted calibration impedance.

21. A circuit, comprising:
a node configured to be coupled to load that includes a signal-propagation medium, the load having an impedance;
a driver including a calibration portion that is configured to drive a calibration signal onto the node; and
a calibrator coupled to the node and configured to:
generate an impedance signal,
compare the impedance signal to the calibration signal, and
adjust the impedance signal in response to the comparison until the impedance signal represents an impedance that is approximately equal to the impedance of the load.

* * * * *